US009449715B2

United States Patent
Fujiwara et al.

(10) Patent No.: US 9,449,715 B2
(45) Date of Patent: Sep. 20, 2016

(54) SEMICONDUCTOR DEVICE HAVING CAPABILITY OF GENERATING CHIP IDENTIFICATION INFORMATION

(71) Applicant: RENESAS ELECTRONICS CORPORATION, Kawasaki-shi, Kanagawa (JP)

(72) Inventors: Hidehiro Fujiwara, Kawasaki (JP); Makoto Yabuuchi, Kawasaki (JP); Koji Nii, Kawasaki (JP); Yoshikazu Saito, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 567 days.

(21) Appl. No.: 14/022,721

(22) Filed: Sep. 10, 2013

(65) Prior Publication Data

US 2014/0070212 A1 Mar. 13, 2014

(30) Foreign Application Priority Data

Sep. 10, 2012 (JP) .................................. 2012-198732

(51) Int. Cl.
*G01R 31/28* (2006.01)
*G06F 11/00* (2006.01)
*G11C 29/12* (2006.01)
*G06K 19/07* (2006.01)
*G11C 7/10* (2006.01)
(Continued)

(52) U.S. Cl.
CPC ............ *G11C 29/12* (2013.01); *G06K 19/0722* (2013.01); *G11C 7/10* (2013.01); *G11C 11/417* (2013.01); *G11C 29/06* (2013.01); *G11C 29/44* (2013.01); *G11C 2029/4402* (2013.01)

(58) Field of Classification Search
CPC ....... G11C 29/03; G11C 29/04; G11C 29/06; G11C 29/12; G11C 29/44
See application file for complete search history.

(56) References Cited

U.S. PATENT DOCUMENTS 6,067,262 A * 5/2000 Irrinki .................. G11C 29/006
365/200
6,367,042 B1 * 4/2002 Phan .................. G01R 31/3187
714/733

(Continued)

FOREIGN PATENT DOCUMENTS

JP       H0737399 A       2/1995
JP       2003187595 A     7/2003

(Continued)

OTHER PUBLICATIONS

Japanese Office Action dated Nov. 24, 2015, issued in Japanese Application No. 2012-198732 (English Translation provided).

(Continued)

*Primary Examiner* — Shelly A Chase
(74) *Attorney, Agent, or Firm* — McDermott Will & Emery LLP

(57) ABSTRACT

A semiconductor device having a capability of generating chip identification information includes: an SRAM macro having a plurality of memory cells arranged in rows and columns; a test address storage unit configured to store a test address; a self-diagnostic circuit configured to output the test address based on a result of confirmation of operation of the memory cell selected by the test address; and an identification information generation circuit configured to generate chip identification information based on the test address which is output by the self-diagnostic circuit.

14 Claims, 21 Drawing Sheets

(51) Int. Cl.
 *G11C 11/417* (2006.01)
 *G11C 29/06* (2006.01)
 *G11C 29/44* (2006.01)

(56) References Cited

U.S. PATENT DOCUMENTS

| | | | |
|---|---|---|---|
| 7,171,596 B2* | 1/2007 | Boehler | G11C 29/48 714/718 |
| 2010/0254205 A1* | 10/2010 | Yamauchi | G11C 17/16 365/200 |
| 2012/0044777 A1 | 2/2012 | Fujiwara et al. | |

FOREIGN PATENT DOCUMENTS

| JP | 2006269023 A | 10/2006 |
|---|---|---|
| JP | 2012-043517 A | 3/2012 |
| JP | 2012073954 A | 4/2012 |

OTHER PUBLICATIONS

H. Fujiwara, et al., "A Chip-ID Generating Circuit for Dependable LSI Using Random Address Errors on Embedded SRAM and On-Chip Memory BIST", Symposium on VLSI Circuits Digest of Techincal Papers 2011, pp. 76-77.

Keith Lofstrom, et al., "IC Identification Circuit Using Device Mismatch", IEEE International Solid-State Circuits Conference 2000.

Y. Su, et al., "A 1.6pJ/bit 96% Stable Chip-ID Generating Circuit Using Process Variations", IEEE International Solid-State Circuits Conference 2007, pp. 406-407, 611.

Shunsuke Okumura, et al., "A 128-bit Chip Identification Generating Scheme Exploiting SRAM Bitcells with Failure Rate of 4.45x10EXP-19" ESSCIRS 2011, pp. 527-530.

Srivatsan Chellappa et al., "Improved Circuits for Microchip Identification Using SRAM Mismatch", CICC 2011.

* cited by examiner (a) (b)

| MEASUREMENT CONDITION | TEMPERATURE (°C) | VOLTAGE(V) | EXTRACTED ADDRESS | NUMBER OF EXTRACTED ADDRESSES |
|---|---|---|---|---|
| WHEN ID IS GENERATED | −20~60 | VDD = 0.6±0.02 | — | — |
| Test(Best) | −40 | VDD = 0.7 | FBAs(FAIL ADDRESS) | 8 |
| Test(Worst) | 100 | VDD = 0.5 | PBAs(PASS ADDRESS) | 248 |

(b)

| MEASUREMENT CONDITION | TEMPERATURE (°C) | VOLTAGE(V) | EXTRACTED ADDRESS | NUMBER OF EXTRACTED ADDRESSES |
|---|---|---|---|---|
| WHEN ID IS GENERATED | −20~60 | VDD = 1.0<br>VWL = 1.2 | — | — |
| Test(Best) | −40 | VDD = 1.0<br>VWL = 1.1 | FBAs(FAIL ADDRESS) | 8 |
| Test(Worst) | 100 | VDD = 1.0<br>VWL = 1.3 | PBAs(PASS ADDRESS) | 248 |

FIG.11
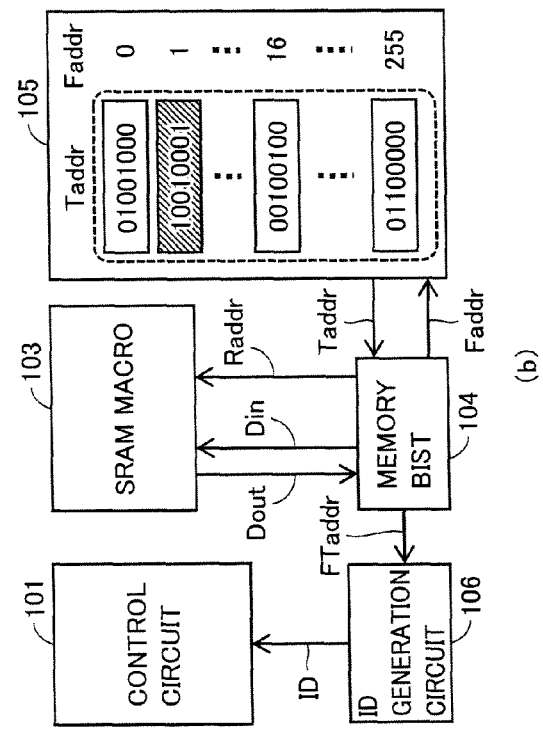
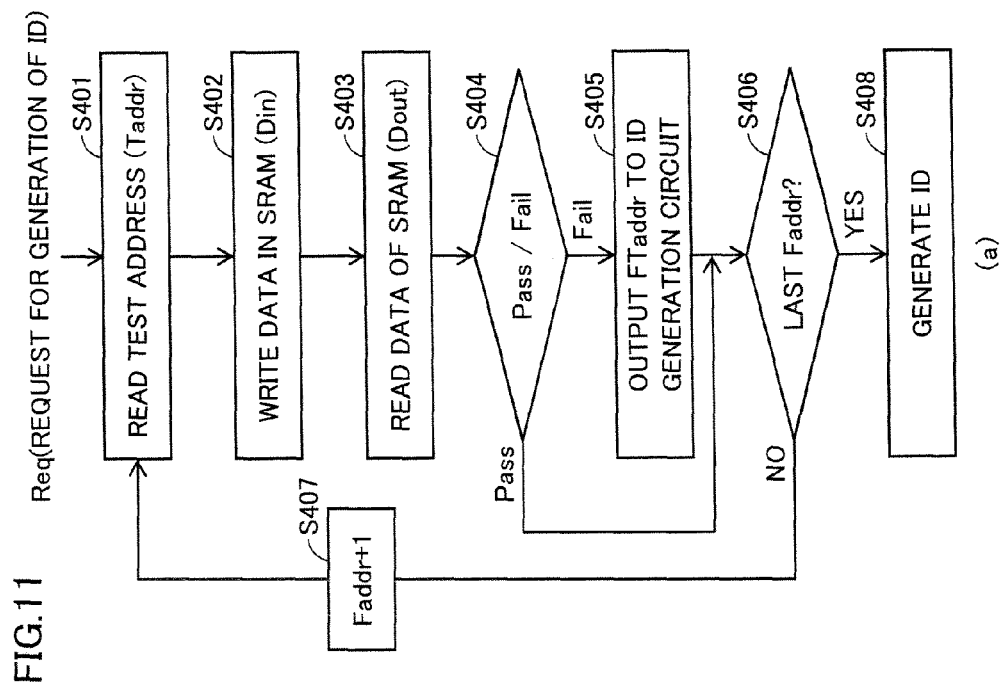

FIG.17
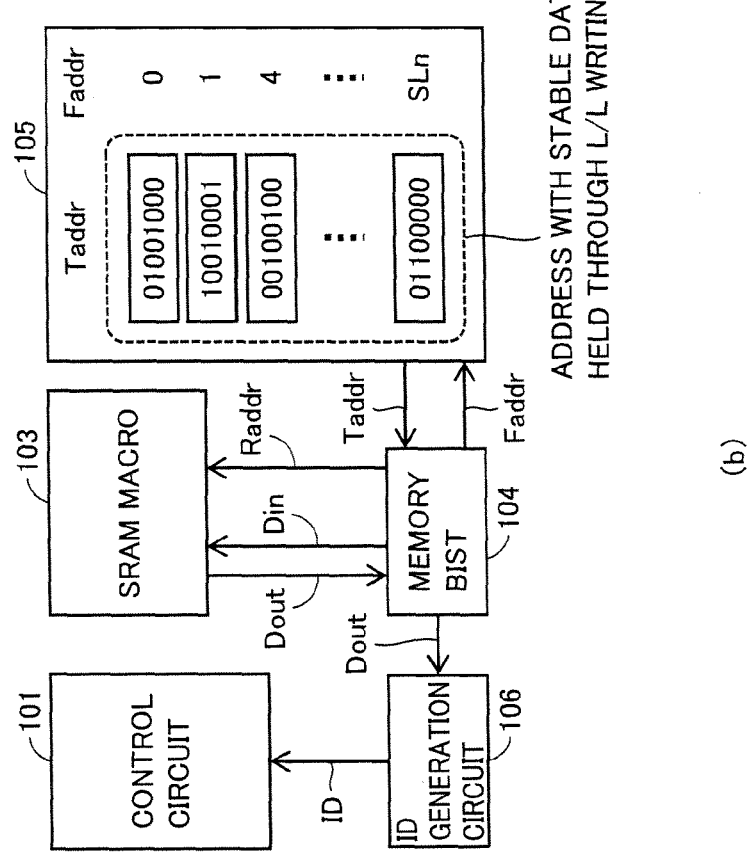
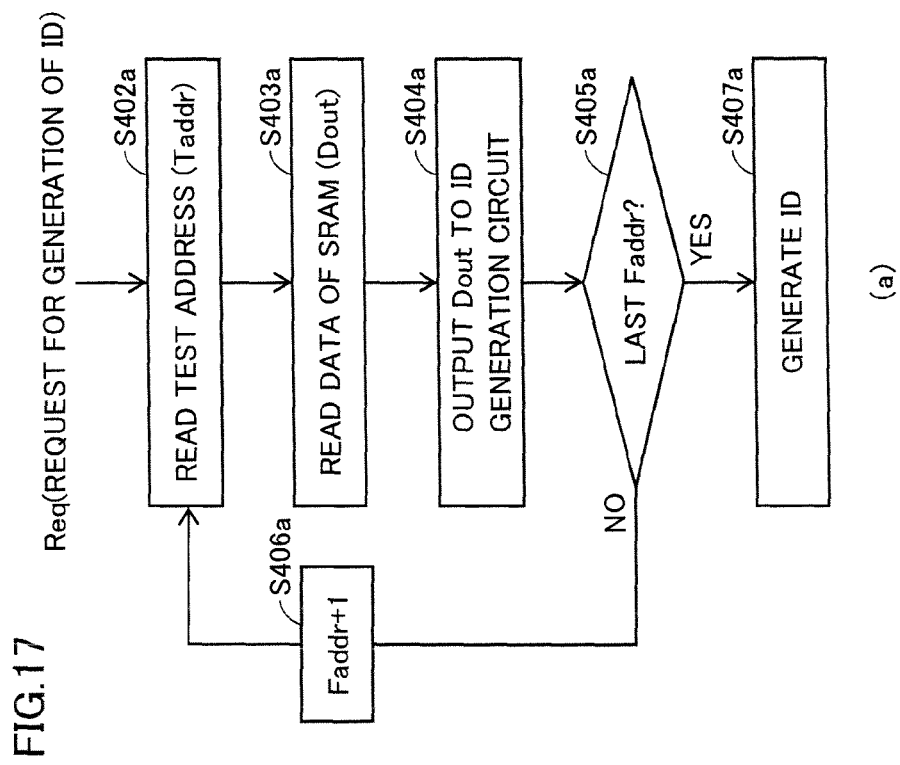

FIG.18
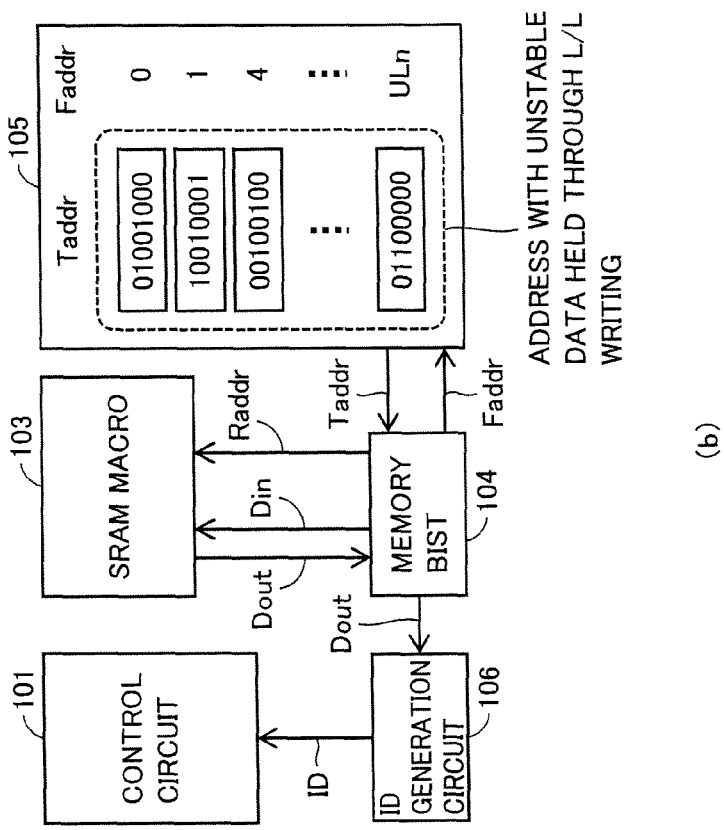
(b)
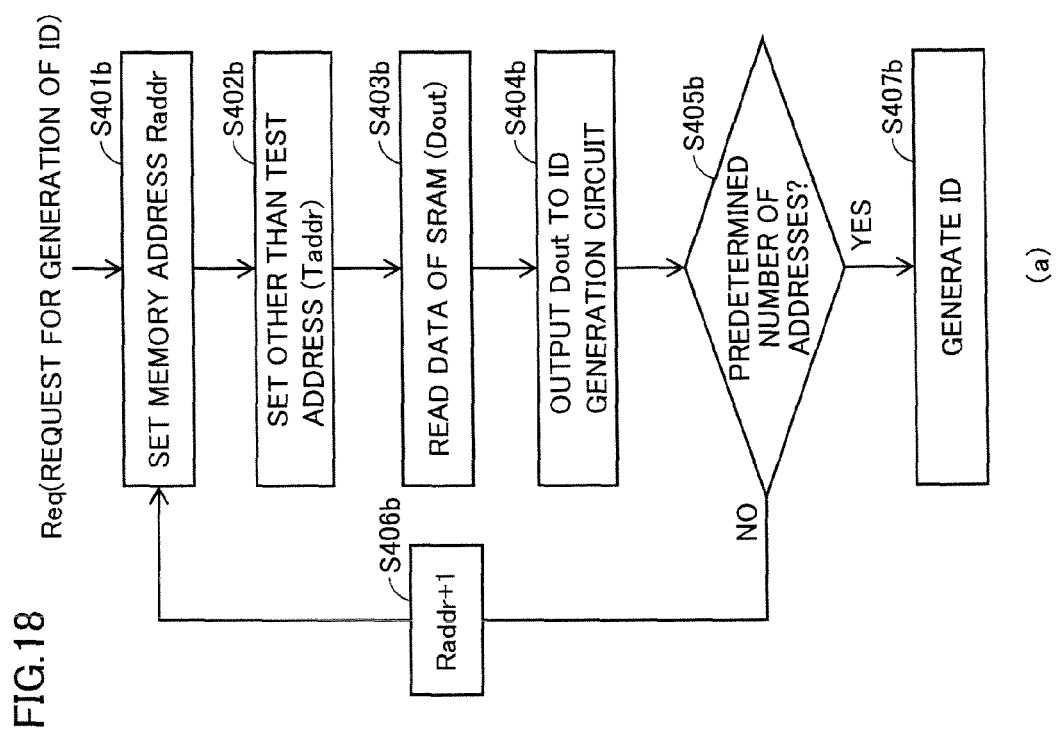
(a)

FIG.22
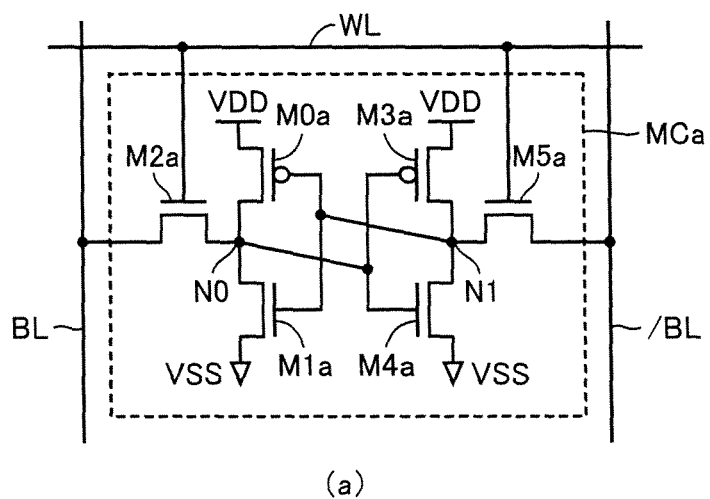
(a)
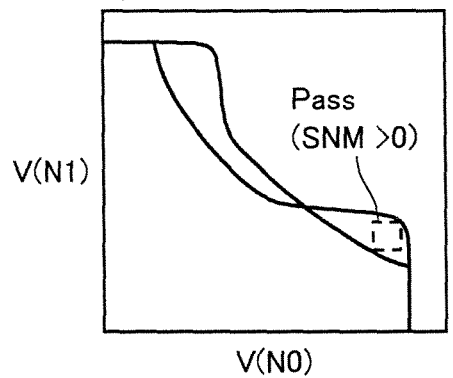
(b)
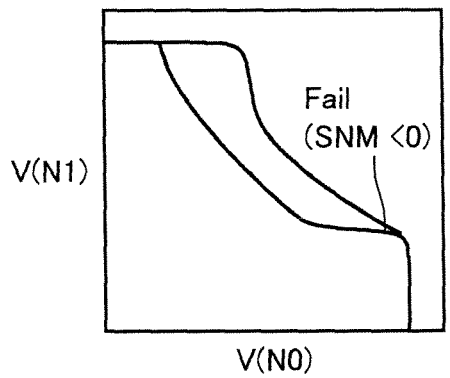
(c)

SEMICONDUCTOR DEVICE HAVING CAPABILITY OF GENERATING CHIP IDENTIFICATION INFORMATION

BACKGROUND OF THE INVENTION

1. Field of the Invention

The present invention relates to a semiconductor device, and particularly to a semiconductor device having a capability of generating chip identification information.

2. Description of the Background Art

The market of electronic commerce services provided/received through the Internet has been expanding. The electronic money service by means of IC cards is now entering the stage of spread/expansion. For these services, a higher security technology is always demanded. At the software level, an encryption technology based on a tough encryption algorithm has offered adequate security. Meanwhile, at the hardware level where a similar algorithm is physically implemented, the risk of allowing a secret key to be decrypted by an attacker such as hacker (cracker) has been pointed out. While a technique of storing an ID in a fuse or nonvolatile memory during production of a chip has conventionally been adopted, the risk of falsification of the data and/or replication of the chip itself has been pointed out.

Japanese Patent Laying-Open No. 2012-43517 and H. Fujiwara et al., "A Chip-ID Generating Circuit for Dependable LSI Using Random Address Errors on Embedded SRAM and On-Chip Memory BIST", VLSI Circuits, 2011 disclose that, based on an address of a random defective cell which is caused by reduction of the voltage to be supplied to memory cells of a built-in SRAM, an ID specific to a chip is generated. K. Lofstrom et al., "IC Identification Circuit Using Device Mismatch", ISSCC 2000 discloses that, based on a change of the output voltage of an inverter constituted of a resistor and a plurality of transistors connected in parallel, an ID specific to a chip is generated. The plurality of transistors have respective threshold voltages different from each other. These transistors are successively accessed and a change of the output voltage of the inverter is digitized. Accordingly, an ID specific to a chip is generated.

Y. Su et al., "A 1.6 pJ/bit 96% Stable Chip-ID Generating Circuit Using Process Variations", ISSCC 2007 discloses a configuration where, based on data held by a cross-coupling-type NOR circuit arranged in the form of an array, an ID specific to a chip is generated. Respective threshold voltages of transistors constituting the cross-coupling-type NOR circuit are set so that they differ from each other in each cross-coupling-type NOR circuit. S. Okumura et al., "A 128-bit Chip Identification Generating Scheme Exploiting SRAM Bitcells with Failure Rate of $4.45 \times 10^{-19}$", ESSCIRS 2011 discloses that a pair of bit lines is set to a low level and thereafter a word line is raised and, based on the value of a data-holding node of a memory cell, an ID specific to a chip is generated. S. Chellappa et al., "Improved Circuits for Microchip Identification Using SRAM Mismatch", CICC 2011 discloses a configuration where a boost voltage is applied to a word line after a pair of bit lines is set to a high level and, based on the value of a data-holding node of a memory cell, an ID specific to a chip is generated.

SUMMARY OF THE INVENTION

A semiconductor device having a capability of generating chip identification information in an embodiment includes: a memory cell array including a plurality of memory cells arranged in rows and columns; a test address storage unit configured to store a test address; a self-diagnostic circuit configured to output the test address based on a result of operational confirmation of the memory cell selected by the test address; and an identification information generation circuit configured to generate chip identification information based on the test address output by the self-diagnostic circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows measurement conditions that are set for the acceleration test on the semiconductor device having a capability of generating chip identification information in the first embodiment.

FIG. 11 shows a diagram illustrating a method for generating chip identification information of the semiconductor device having a capability of generating chip identification information in the first embodiment.

FIG. 17 shows a flow diagram of a procedure for generating chip identification information of the semiconductor device having a capability of generating chip identification information in the first modification of the first embodiment.

FIG. 18 shows another flow diagram of a procedure for generating chip identification information of the semiconductor device having a capability of generating chip identification information in the first modification of the first embodiment.

FIG. 22 shows a configuration diagram of an ID-generation SRAM macro included in the semiconductor device having a capability of generating chip identification information in the third embodiment.

DESCRIPTION OF THE PREFERRED EMBODIMENTS

Figure 1:
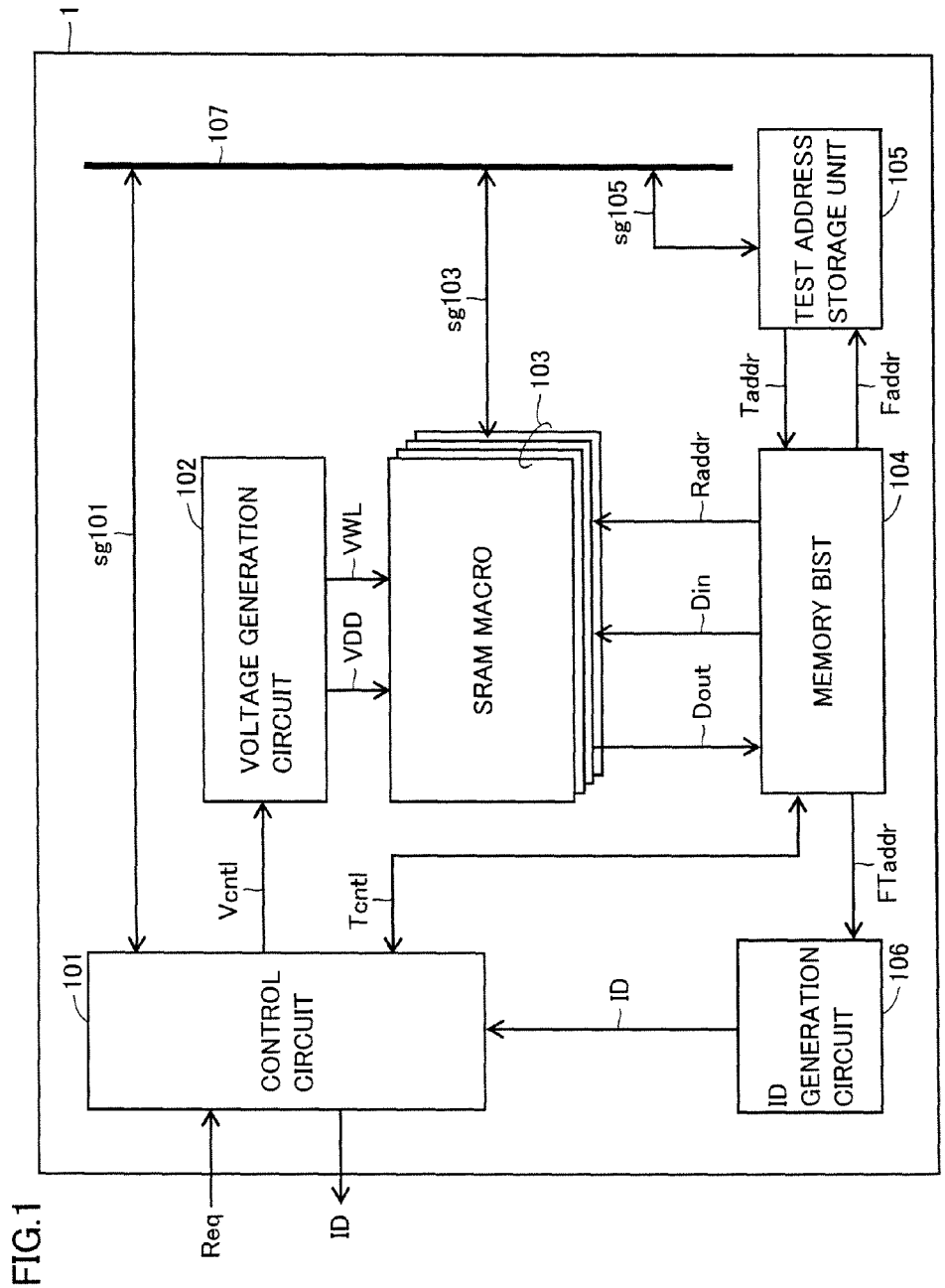
FIG. 1 shows a configuration diagram of a semiconductor device having a capability of generating chip identification information in a first embodiment.

In the following, embodiments will be described with reference to the drawings. In the description of the embodiments, the number, amount, or the like mentioned therein is not necessarily limited to the exact number, amount, or the like unless otherwise specified. In the drawings for the embodiments, the same reference characters or reference numerals represent the same or corresponding components. Further, in the description of the embodiments, a description of the components denoted by the same reference characters or the like may not be repeated depending on the case.

First Embodiment

Referring to FIG. 1, a configuration of a semiconductor device 1 in a first embodiment will be described.

Semiconductor device 1 includes a control circuit 101, a voltage generation circuit 102, an SRAM macro 103, a memory BIST (Built-In Self Test: self-diagnostic circuit) 104, a test address storage unit 105, an ID generation circuit 106, and an internal bus 107. Control circuit 101 uses a signal Vcnt1 to control a power supply voltage VDD and a word line voltage VWL that are output from voltage generation circuit 102. Further, control circuit 101 uses a signal Tcnt1 to control the operation of memory BIST 104, and transmits/receives a signal sg101 to/from internal bus 107. It should be noted that semiconductor device 1 will also be referred to herein as "chip" depending on the case.

SRAM macro 103 includes a memory cell array (not shown) made up of a plurality of memory cells MC (see FIG. 2(a)) arranged in rows and columns, a sense amplifier SA (see FIG. 2(b)), and other components such as a peripheral circuit and a control circuit (not shown) necessary for read and write operations for memory cells MC. To SRAM macro 103, power supply voltage VDD and word line voltage VWL are supplied. Further, SRAM macro 103 transmits/receives a signal sg103 to/from internal bus 107. The I/O width of SRAM macro 103 has N bits where N is set to a predetermined number.

Test address storage unit 105 stores a plurality of test addresses Taddr, which will be described later herein. Each test address Taddr is selected by a storage address Faddr. Test address storage unit 105 is configured by a nonvolatile memory device such as e-fuse, flash memory, or the like which will hold data even if supply of the power supply voltage to semiconductor device 1 is shut off. The e-fuse is a fuse which is short-circuited or fixed in a disconnected state by application of predetermined electric current.

Memory BIST 104 is a self-diagnostic circuit controlling the operation of the SRAM macro, and the operation of memory BIST 104 is controlled in accordance with signal Tcnt1 which is output from control circuit 101. In response to storage address Faddr which is output from memory BIST 104, test address storage unit 105 outputs, to the memory BIST, test address Taddr associated with this storage address Faddr. Memory BIST 104 outputs, based on test address Taddr, a memory address Raddr to SRAM macro 103. Further, memory BIST 104 outputs to SRAM macro 103 write data Din for memory cell MC which is selected by memory address Raddr.

Memory BIST 104 receives from SRAM macro 103 read data Dout of memory cell MC which is selected by memory address Raddr. Memory BIST 104 determines whether write data Din and read data Dout match or mismatch each other. When these data mismatch each other, memory BIST 104 outputs memory address Raddr as a fail address FTaddr.

ID generation circuit 106 generates chip identification information ID based on fail address FTaddr and the like, and outputs chip identification information ID to control circuit 101. In response to a request signal Req, control circuit 101 outputs chip identification information ID. The source of this request signal Req and the destination of chip identification information ID are a server (not shown) connected through the Internet to an information terminal device (such as PC, mobile phone, or the like) on which semiconductor device 1 is mounted. When the chip identification information ID transmitted to the server matches chip identification information registered in the server, an electronic commerce service is started via the Internet.

Figure 2:
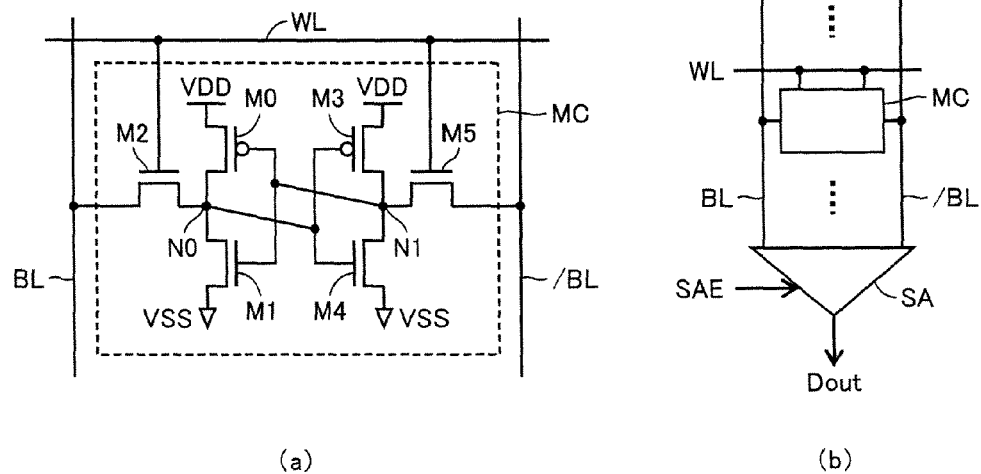
FIG. 2 shows respective circuit configuration diagrams of a memory cell and a sense amplifier included in the semiconductor device having a capability of generating chip identification information in the first embodiment.

Referring to FIG. 2, a description will be given of respective circuit configurations of memory cell MC and sense amplifier SA which are included in SRAM macro 103 of semiconductor device 1 in the first embodiment.

FIG. 2(a) shows a circuit configuration of memory cell MC. Memory cell MC is a six-transistor type SRAM cell. A p-type transistor M0 has its source to which power supply voltage VDD is applied, and its gate and drain connected respectively to a node N1 and a node N0. An n-type transistor M1 has its source to which power supply voltage VSS is applied, and its gate and drain connected respectively to node N1 and node N0. A p-type transistor M3 has its source to which power supply voltage VDD is applied, and its gate and drain connected respectively to node N0 and node N1. An n-type transistor M4 has its source to which power supply voltage VSS is applied, and its gate and drain connected respectively to node N0 and node N1.

An n-type transistor M2 has its gate connected to a word line WL, one of its source and drain connected to node N0, and the other of its source and drain connected to a bit line BL. An n-type transistor M5 has its gate connected to word line WL, one of its source and drain connected to node N1, and the other of its source and drain connected to a bit line /BL.

FIG. 2(b) shows a circuit configuration of sense simplifier SA. Data which is held on node N0 and data which is held on node N1 of memory cell MC are output respectively to bit line BL and bit line /BL. When the voltage between bit line BL and bit line /BL becomes higher than a predetermined value, sense amplifier SA outputs read data Dout having a binary value for a high level (power supply voltage VDD) or a low level (power supply voltage VSS). Regarding the first embodiment, it is defined that when the potential of bit line BL is higher than and lower than the potential of bit line /BL, read voltage Dout with the high level and read voltage Dout with the low level are output, respectively. This read operation of sense amplifier SA is activated when a sense amplifier enable signal SAE is the high level. Sense amplifier enable signal SAE is controlled by memory BIST 104.

Figure 3:
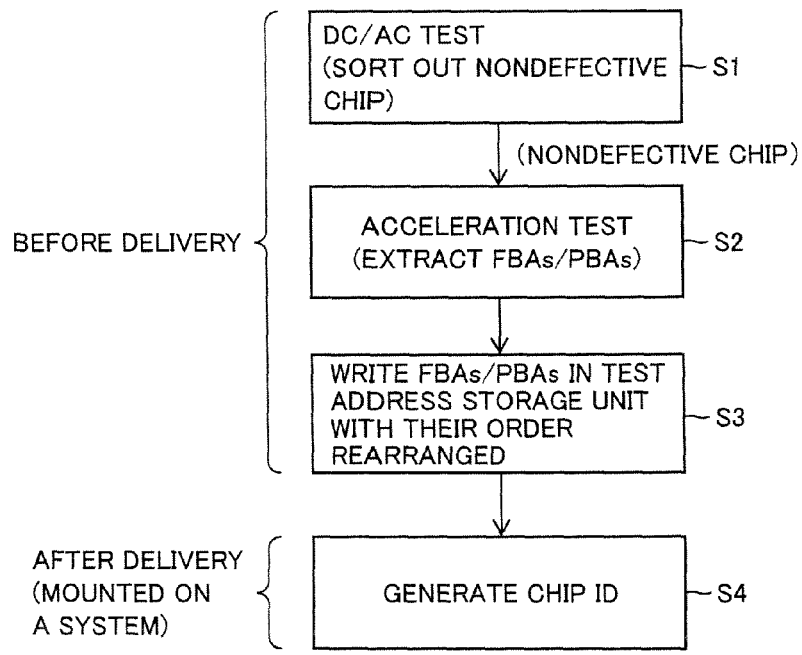
FIG. 3 shows a flow diagram of a procedure for generating chip identification information of the semiconductor device having a capability of generating chip identification information in the first embodiment.

Referring to FIG. 3, a description will be given of a flow of a procedure for generating chip identification information ID of semiconductor device 1 in the first embodiment.

Chip identification information ID is generated by semiconductor device 1 through four steps of the procedure for semiconductor device 1.

In step S1, semiconductor device 1 identified as a nondefective chip is sorted out. A nondefective chip satisfying a catalog specification for semiconductor device 1 is sorted out by an LSI tester 109 (see FIG. 4). The nondefective chip which is thus sorted out satisfies DC characteristics (direct current characteristics) and AC characteristics (setup/hold time, access time, and the like) of the operating conditions defined by the catalog specification.

In step S2, an acceleration test is performed on the nondefective chip. The acceleration test is a test in which data is written in and data is read from a memory cell under operating conditions beyond a set range of power supply voltage and a set range of temperature for example that are defined by the catalog specification. In the acceleration test, a predetermined number of addresses of memory cells whose write data and read data match each other are extracted as stable pass bit addresses PBAs. Further, a predetermined number of addresses of memory cells whose write data and read data do not match each other are extracted as stable fail bit addresses FBAs. While semiconductor device 1 is being operated within the catalog specification, both the memory cells selected by stable pass bit addresses PBAs and stable fail bit addresses FBAs operate normally.

In step S3, test addresses Taddr are stored in test address storage unit 105. Test addresses Taddr are made up of the extracted stable pass bit addresses PBAs and stable fail bit addresses FBAs. These stable pass bit addresses PBAs and stable fail bit addresses FBAs are written in test address storage unit 105 in such a manner that they are mixed together in the storage unit. These steps S1 to S3 are performed as a part of a chip manufacture process prior to delivery of semiconductor device 1.

In step S4, chip identification information ID is generated. Chip identification information ID is generated based on the result of confirmation of the operation of memory cells selected by stable pass bit address PBAs and stable fail bit address FBAs stored in test address storage unit 105. At this time, semiconductor device 1 is in the state of being mounted on an information terminal device.

Figure 4:
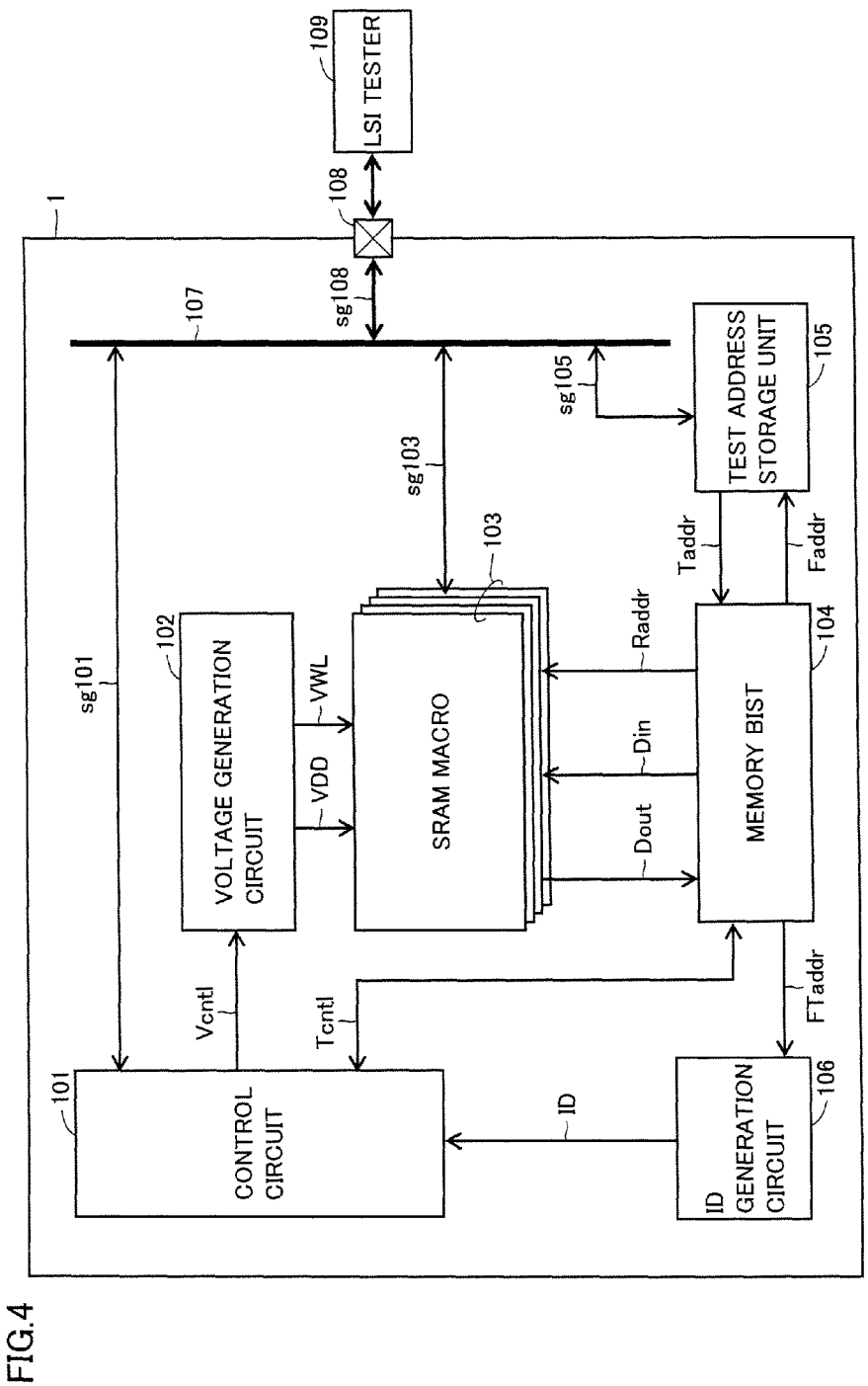
FIG. 4 shows a configuration diagram in the case where an acceleration test is performed on the semiconductor device having a capability of generating chip identification information in the first embodiment and a test address is stored in the semiconductor device.

Referring to FIG. 4, a description will be given of a configuration in the case where an acceleration test is performed on semiconductor device 1 (step S2) in the first embodiment and test addresses are stored in semiconductor device 1 (step S3).

Internal bus 107 included in semiconductor device 1 is connected through a data transmission pass sg108 and a contact portion 108 to LSI tester 109. Here, contact portion 108 is schematically shown as being configured to electrically connect semiconductor device 1 and LSI tester 109 to each other. For example, the contact portion corresponds to a pad formed on semiconductor device 1 and a prober connected to LSI tester 109. Data transmission pass sg108 is a control circuit connected between the aforementioned pad and internal bus 107.

Stable pass bit addresses PBAs and stable fail bit addresses FBAs extracted in step S2 of FIG. 3 are stored from internal bus 107 into a memory (not shown) of LSI tester 109 through data transmission pass sg108 and contact portion 108. In step S3, a predetermined number of stable pass bit addresses PBAs and a predetermined number of stable fail bit addresses FBAs stored in the memory of LSI tester 109 are written in test address storage unit 105 through internal bus 107 and a data transmission pass sg105.

Figure 5:
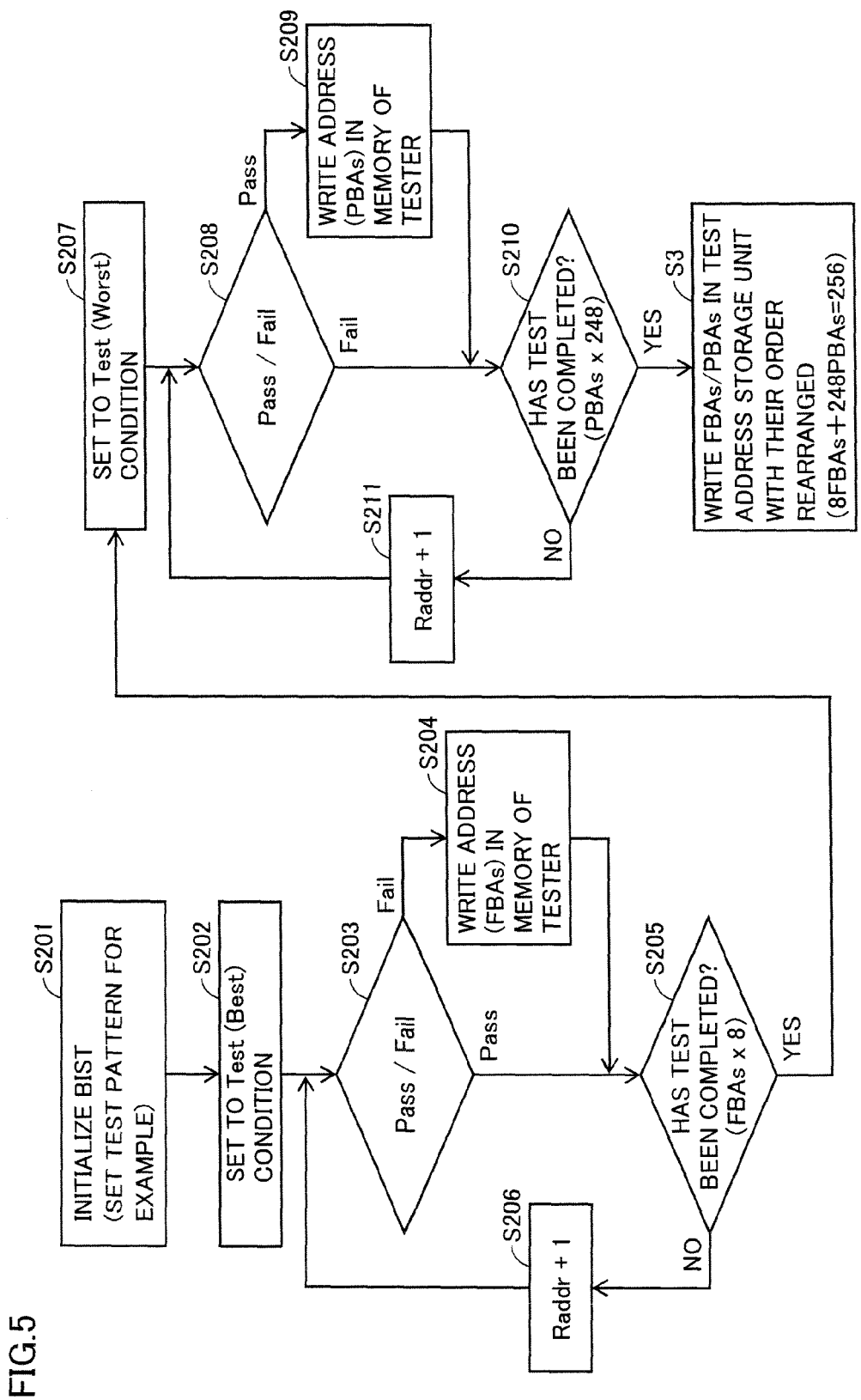
FIG. 5 shows a detailed flow diagram of a procedure of the acceleration test on the semiconductor device having a capability of generating chip identification information in the first embodiment.

Referring to FIGS. 5 and 6, a method for the acceleration test on semiconductor device 1 in the first embodiment will be described.

FIG. 5 shows a detailed flow diagram of a procedure for the acceleration test on semiconductor device 1 in the first embodiment. FIG. 6 shows measurement conditions that are set for the acceleration test on semiconductor device 1 in the first embodiment.

In the acceleration test (step S2), for the nondefective chip sorted out in the DC/AC test (step S1), the operation of the chip is confirmed under severer measurement conditions. The power supply voltage and the measurement temperature for example are set in step S2 of FIG. 3 in respective ranges beyond (out of) the ranges of measurement conditions defined by the catalog specification that are set in step S1. As a result, in the nondefective chip which as been sorted out in step S1, some cells become operationally defective under the measurement conditions of step S2. The manner of distribution of respective addresses of the operationally defective cells is specific to the chip.

In step S201 of FIG. 5, memory BIST 104 included in semiconductor device 1 is initialized. For example, a test pattern for SRAM macro 103 is set by LSI tester 109.

In step S202, a first measurement condition for confirming the operation of SRAM macro 103 is set. In the following, the first measurement condition will also be referred to as "Test (Best)" depending on the case. As the measurement condition, the power supply voltage and the measurement temperature or the measurement timing for example are set. In FIG. 6(a), the row of "Test (Best)" indicates specific examples of the first measurement condition. Under the Test (Best) condition, power supply voltage VDD is set at 0.7 V and the measurement temperature is set at −40° C.

In step S203, for a memory cell of SRAM macro 103 for which the Test (Best) condition is set, whether its write data Din and read data Dout match (Pass) or mismatch (Fail) each other is determined. A memory cell address in which one or more I/O bits out of N bits of the I/O width of SRAM macro 103 are determined to be "Fail" is identified as stable fail bit address FBAs and accordingly extracted.

In step S204, the memory cell address determined to be "Fail" in step S203 is written as stable fail bit addresses FBAs in the memory of LSI tester 109.

In step S205, whether or not extraction of a predetermined number of stable fail bit addresses FBAs is completed is determined. For example, when eight stable fail bit addresses FBAs have been extracted (YES), the procedure proceeds to the next step S207. When the number of extracted stable fail bit addresses is less than eight (NO), the procedure proceeds to step S206 in which address Raddr of the memory cell whose operation is confirmed is incremented by one.

In step S207, a second measurement condition for confirming the operation of SRAM macro 103 is set. In the following, the second measurement condition will also be referred to as "Test (Worst)" depending on the case. In FIG. 6(a), the row of "Test (Worst)" indicates specific examples of the second measurement condition. Under the Test (Worst) condition, power supply voltage VDD is set at 0.5 V and the measurement temperature is set at 100° C.

In step S208, for a memory cell of SRAM macro 103 for which the Test (Worst) condition is set, whether its write data Din and read data Dout match (Pass) or mismatch (Fail) each other is determined. A memory cell address in which all of the N bits of the I/O width of SRAM macro 103 are determined to be "Pass" is identified as stable pass bit address PBAs and accordingly extracted.

In step S209, the memory cell address determined to be "Pass" in step S208 is written as stable pass bit address PBAs in the memory of LSI tester 109.

In step S210, whether or not extraction of a predetermined number of stable pass bit addresses PBAs is completed is determined. For example, when 248 stable pass bit addresses PBAs have been extracted (YES), the procedure proceeds to step S3. When the number of extracted stable pass bit addresses is less than 248 (NO), the procedure proceeds to step S211 in which address Raddr of the memory cell whose operation is confirmed is incremented by one.

In step S3, the extracted eight stable fail bit addresses FBAs and 248 stable pass bit addresses PBAs are written in test address storage unit 105 with their order rearranged appropriately.

Referring to FIG. 6(a), differences will be described between the first measurement condition (Test (Best)) and the second measurement condition (Test (Worst)) that are set for the acceleration test (step S2) and a third measurement condition (at the time of ID generation) that is set in step S4 of generating chip identification information ID.

Regarding the first to third measurement conditions, respective measurement temperatures are different from each other and respective power supply voltages VDD are different from each other. In view of the set values of the measurement temperature and power supply voltage VDD, respective static noise margins (hereinafter also referred to as SNM depending on the case) when a memory cell is read under respective measurement conditions are understood to have a relation therebetween as follows. Specifically, where respective SNM for the first measurement condition (Test (Best)), the second measurement condition (Test (Worst)), and the third measurement condition (at the time of ID generation) are represented by SNM1, SNM2, and SNM3, they have a relation therebetween: SNM1>SNM3>SNM2.

Accordingly, a memory cell selected by stable fail bit address FBAs extracted under the first measurement condition (Test (Best)) in step S203 (see FIG. 5) will surely be determined to be a fail bit (write data and read data mismatch each other) under the third measurement condition (at the time of ID generation) for which the SNM is set smaller than that for the first measurement condition.

Likewise, a memory cell selected by stable pass bit address PBAs extracted under the second measurement condition (Test (Worst)) in step S208 (see FIG. 5) will surely be determined to be a pass bit (write data and read data match each other) as well under the third measurement condition (at the time of ID generation) for which the SNM is set larger than that for the second measurement condition.

In the detailed flow of step S2 shown in FIG. 5, even when the first measurement condition (Test (Best)) set in step S202 and the second measurement condition (Test (Worst)) set in step S207 are changed to those shown in FIG. 6(b), the above-indicated relation is maintained as it is.

Regarding the first to third measurement conditions shown in FIG. 6(b), respective measurement temperatures are different from each other and respective word line voltages VWL (voltage applied to a selected word line) are different from each other. A larger word line voltage VWL causes SNM to decrease. Therefore, respective SNM for the first measurement condition (Test (Best)), the second measurement condition (Test (Worst)), and the third measurement condition (at the time of ID generation) have a relation therebetween: SNM1>SNM3>SNM2 similarly to the case where respective conditions indicated in FIG. 6(a) are applied.

Accordingly, a memory cell selected by stable fail bit address FBAs extracted in step S203 will surely be determined to be a fail bit in the step of generating chip identification information ID in step S4. Likewise, a memory cell selected by stable pass bit address PBAs will surely be determined to be a pass bit in step S4 as well.

Figure 7:
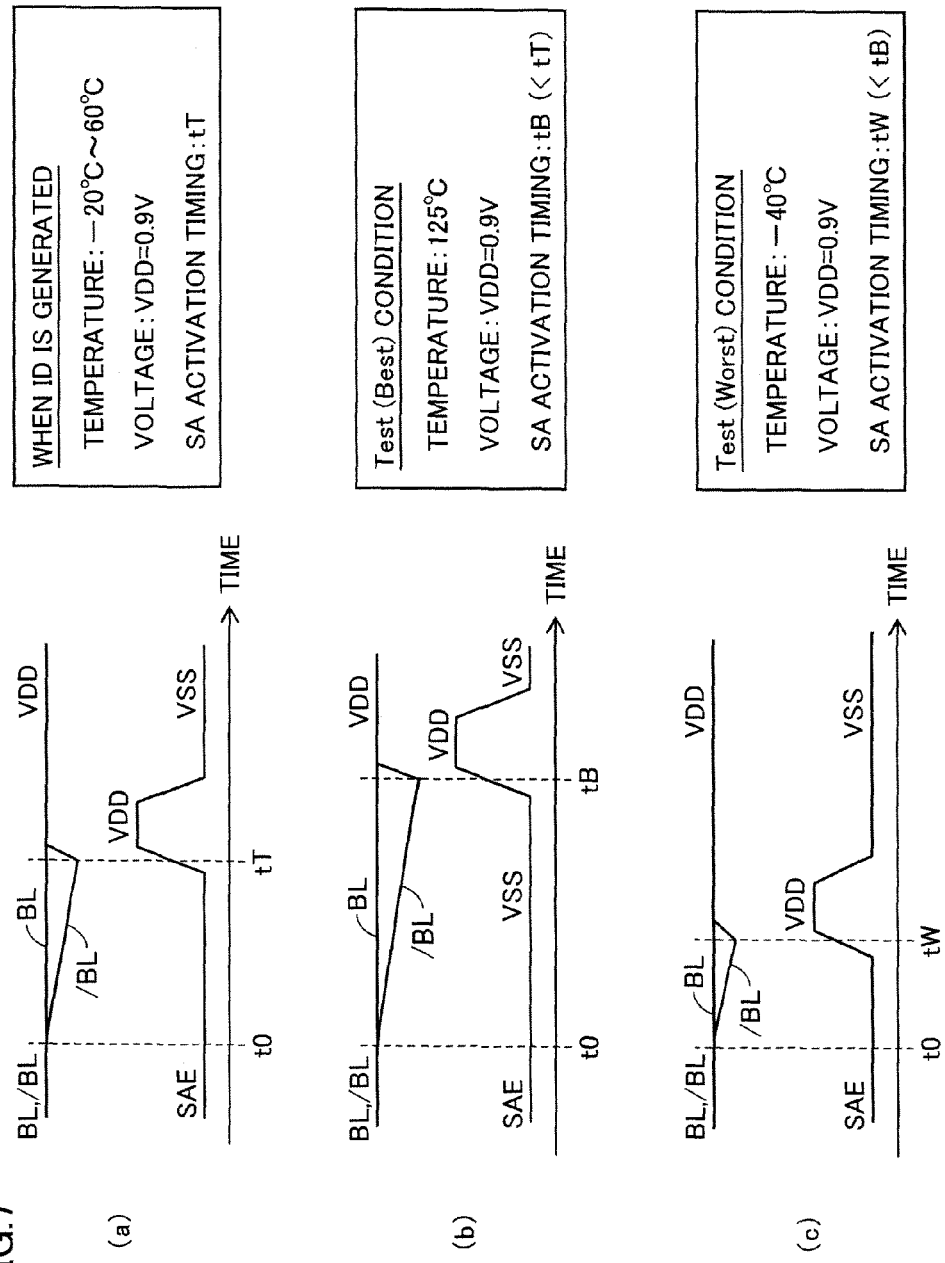
FIG. 7 shows timing charts illustrating another example of the acceleration test on the semiconductor device having a capability of generating chip identification information in the first embodiment.

Referring to FIG. 7, another example of the acceleration test on semiconductor device 1 in the first embodiment will be described.

FIG. 7 shows timing charts where the measurement conditions under which stable fail bit addresses FBAs/stable pass bit addresses PBAs are extracted in step S2 are changed from the conditions for setting SNM as shown in FIG. 6 to the conditions for the sense amplifier activation timing.

FIG. 7(b) shows a timing chart illustrating a first measurement condition (Test (Best)) which is set when stable fail bit address FBAs is to be extracted. The measurement temperature and power supply voltage VDD are set respectively at 125° C. and 0.9 V.

At time t0, word line WL is raised from the low level to the high level (not shown). At time tB, sense amplifier SA is activated by sense amplifier enable signal SAE (see FIG. 2). After a predetermined time from time tB, whether a memory cell is "Pass" or "Fail" is determined based on the result of comparison between output data Dout of sense amplifier SA and write data Din to the memory cell (not shown). The address of the memory cell which is "Fail" at this sense amplifier activation timing tB is identified as stable fail bit address FBAs and accordingly extracted.

FIG. 7(c) shows a timing chart illustrating a second measurement condition (Test (Worst)) which is set when stable pass bit address PBAs is to be extracted. The measurement temperature and power supply voltage VDD are set respectively at −40° C. and 0.9 V. After word line WL is activated at time t0, sense amplifier SA is activated at time tW. After a predetermined time from time tW, whether a memory cell is "Pass" or "Fail" is determined The address of the memory cell which is "Pass" at this sense amplifier activation timing tW is identified as stable pass bit address PBAs and accordingly extracted.

FIG. 7(a) shows a timing chart illustrating a third measurement condition (at the time of ID generation) which is set in step S4 of generating chip identification information ID. The measurement temperature and power supply voltage VDD are set respectively at −20° C. to 60° C. and 0.9 V. After word line WL is activated at time t0, sense amplifier SA is activated at time tT. After a predetermined time from time tT, whether a memory cell is "Pass" or "Fail" is determined.

For the first to third measurement conditions, power supply voltage VDD is set at 0.9 V. In contrast, respective sense amplifier activation timings for the first measurement condition (Test (Best)), the second measurement condition (Test (Worst)), and the third measurement condition (at the time of ID generation) have a relation therebetween: tW<tT<tB. The voltage between bit line BL and bit line /BL after activation of word line WL increases with the lapse of time from time t0.

Accordingly, a memory cell selected by stable fail bit address FBAs extracted under the first measurement condition will surely be determined to be a fail bit under the third measurement condition under which the sense amplifier is activated at an earlier timing than that under the first measurement condition. Likewise, a memory cell selected by stable pass bit address PBAs extracted under the second measurement condition will surely be determined to be a pass bit under the third measurement condition under which the sense amplifier is activated at a later timing than that under the second measurement condition.

Figure 8:
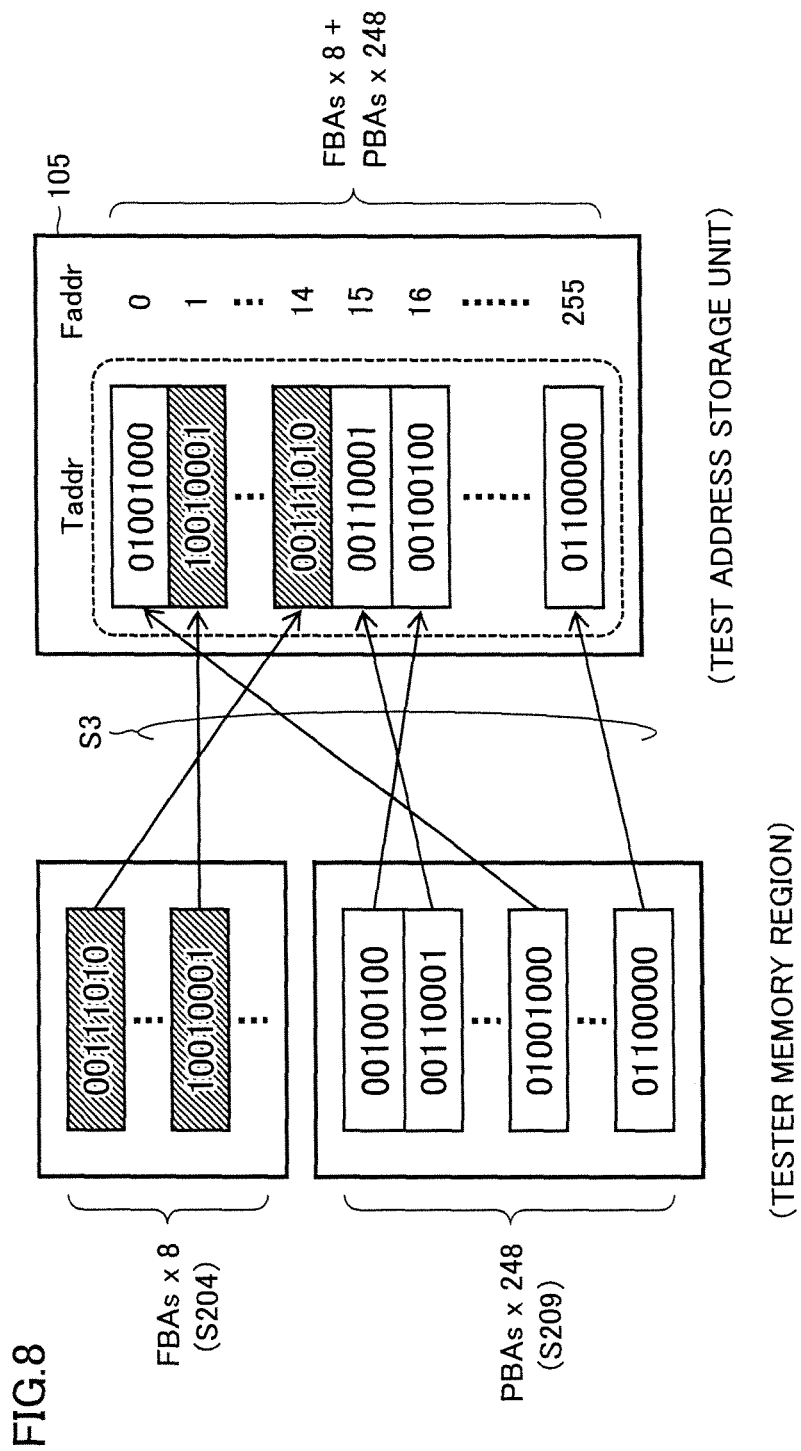
FIG. 8 shows a diagram illustrating the step of storing test addresses for the semiconductor device having a capability of generating chip identification information in the first embodiment.

Referring to FIG. 8, the step of storing test addresses for semiconductor device 1 in the first embodiment will be described.

In step S3 (test addresses are stored), stable pass bit addresses PBAs and stable fail bit addresses FBAs extracted in step S2 (acceleration test) are written in test address storage unit 105.

As shown in FIG. 8, in a memory region of LSI tester 109 (see FIG. 4) (the region will also be referred to as "tester memory region" depending on the case), eight stable fail bit addresses FBAs and 248 stable pass bit addresses PBAs are stored. In step S3, the 256 pieces of address data in total that are stored in the tester memory region are stored in test address storage unit 105.

Test address storage unit 105 stores the 256 pieces of address data as test addresses Taddr. Test addresses Taddr stored in test address storage unit 105 are associated respectively with storage addresses Faddr (0 to 255). The storage addresses Faddr are designated to thereby access stable fail bit address FBAs and stable pass bit address PBAs stored in test address storage unit 105.

In step S3, stable fail bit addresses FBAs and stable pass bit addresses PBAs stored in the tester memory region are randomly rearranged in test address storage unit 105. Here, the random rearrangement means that stable fail bit addresses FBAs and stable pass bit addresses PBAs are not grouped but mixed together.

Figure 9:
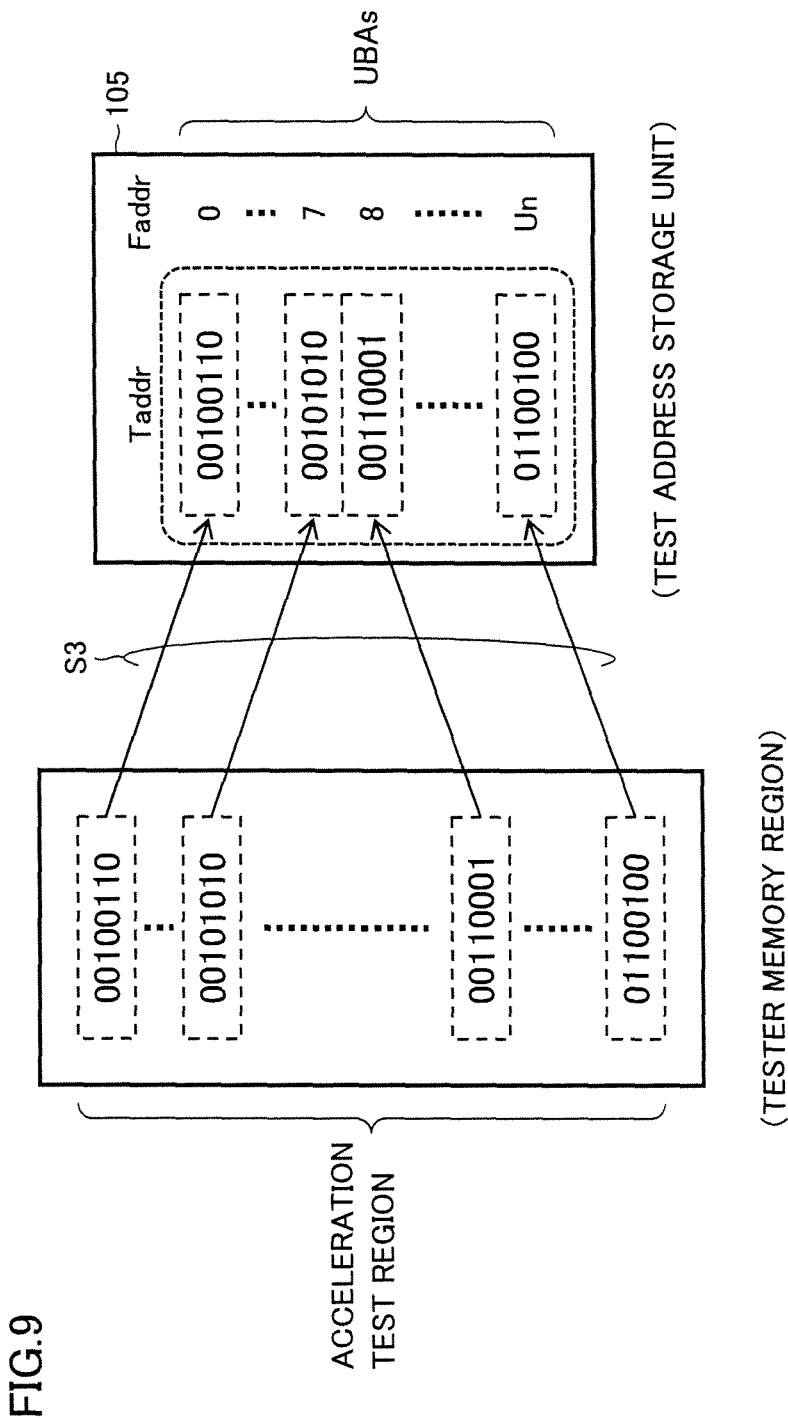
FIG. 9 shows a diagram illustrating a first example of the step of storing test addresses for the semiconductor device having a capability of generating chip identification information in the first embodiment.

Referring to FIG. 9, a first example of the step of storing test addresses for semiconductor device 1 in the first embodiment will be described.

FIG. 9 shows the example of step S3 of writing, in test address storage unit 105, an unstable bit address UBAs extracted in step S2 (acceleration test). Unstable bit address UBAs is an address of a memory cell that is determined to be "Pass" during execution of step S2 under both the first measurement condition (Test (Best)) and the second measurement condition (Test (Worst)), or "Fail" during execution of step S2 under both the first measurement condition (Test (Best)) and the second measurement condition (Test (Worst)). Otherwise, the unstable bit address is an address, for example, of a memory cell which is not constantly determined to be "Pass" or "Fail" each time the step is executed under the first measurement condition.

In steps S203 and S208 that are included in step S2 and shown in FIG. 5, the range of memory cell addresses for which determined whether the memory cell addresses are "Pass" or "Fail" is herein an acceleration test region from which a predetermined number Un+1 of unstable bit addresses UBAs are extracted.

As shown in FIG. 9, in the tester memory region of LSI tester 109, a predetermined number Un+1 of unstable bit addresses UBAs, stable fail bit addresses FBAs, and stable pass bit addresses PBAs that are extracted in step S2 are stored. In step S3, the predetermined number Un+1 of unstable bit addresses UBAs which are located in the tester memory region are written as test addresses Taddr in test address storage unit 105.

It has already been confirmed that the memory cell addresses located in the acceleration test region except for the unstable bit addresses UBAs are each one of stable fail bit address FBAs and stable pass bit address PBAs. Thus, when chip identification information ID is to be generated in step S4, an address in the acceleration test region except for the addresses stored in test address storage unit 105 can be selected to generate identification information specific to the chip.

Figure 10:
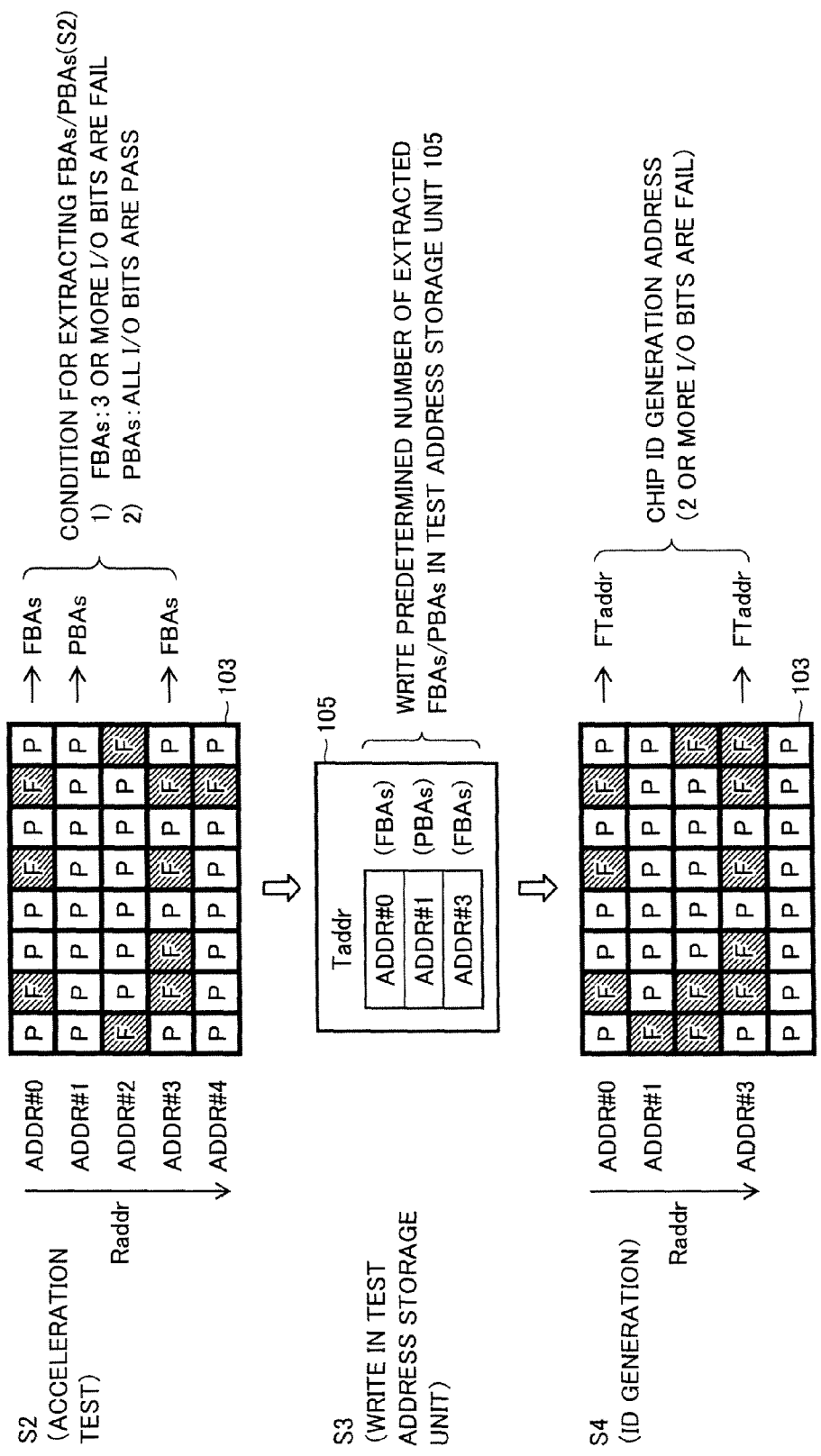
FIG. 10 shows a diagram illustrating a second example of the step of storing test addresses for the semiconductor device having a capability of generating chip identification information in the first embodiment.

Referring to FIG. 10, a second example of the step of storing test addresses for semiconductor device 1 in the first embodiment will be described.

FIG. 10 shows the example of step S2 of extracting stable fail bit addresses FBAs and extracting stable pass bit addresses PBAs in consideration of the number of I/O bits determined to be "Fail" and the number of I/O bits determined to be "Pass" respectively.

Stable fail bit address FBAs (S203) in step S2 shown in FIG. 5 corresponds to a memory cell address in which one or more I/O bits out of N bits of the I/O width are determined to be "Fail." Further, stable pass bit address PBAs (S208) corresponds to a memory cell address in which all bits (N bits) out of the N bits of the I/O width are determined to be "Pass."

In contrast, in step S2 shown in FIG. 10, in the case for example where the I/O width of SRAM macro 103 is eight bits, a memory cell address in which three or more bits of the I/O width out of the eight bits of the I/O width are determined to be "Fail" is identified as stable fail bit address FBAs and accordingly extracted. In the case of this example, ADDR#0 and ADDR#3 of the memory addresses Raddr correspond to stable fail bit addresses FBAs. Further, in the example of FIG. 10, memory cell address ADDR#1 in which all I/O bits out of the eight bits of the I/O width are determined to be "Pass" is identified as stable pass bit address PBAs and accordingly extracted.

In step S3, the extracted stable fail bit addresses FBAs and stable pass bit address PBAs are stored as test addresses Taddr in test address storage unit 105. In the example of FIG. 10, ADDR#0 and ADDR#3 which are stable fail bit addresses FBAs as well as ADDR#1 which is stable pass bit address PBAs are stored.

In step S4, test addresses Taddr are read successively from test address storage unit 105, and the operation of the memory cells in SRAM macro 103 that are selected by respective test addresses is confirmed. In this case, the memory cell addresses (ADDR#0, ADDR#3) in which two or more bits out of the I/O width have been determined to be "Fail" are extracted as fail addresses FTaddr.

The criteria for determining whether an address is a Fail address or a Pass address in step S2 (acceleration test) and step S4 (ID generation) shown in FIG. 10 are summarized in the following.

In step S2, a memory cell address in which N2f or more bits out of the N bits of the I/O width are determined to be "Fail" under the first measurement condition (Test (Best)) is identified as stable fail bit address FBAs and accordingly extracted. In step S4, stable fail bit address FBAs in which N4f or more bits out of the N bits of the I/O width are determined to be "Fail" under the third measurement condition (ID generation) is identified as a fail address FTaddr and accordingly output.

Here, the number of bits N2f and the number of bits N4f are defined as follows.

$$N2f > N4f$$

$$N2f - N4f = \Delta Nf \quad \text{Formula 1}$$

The number of bits N2f and the number of bits N4f are thus defined by Formula 1 so that chip identification information ID is stably generated in step S4 based on stable fail bit addresses FBAs extracted in step S2, even if the number of I/O bits determined to be "Pass" in stable fail bit address FBAs is $\Delta Nf$ or less.

Likewise, in step S2, a memory cell address in which N2p or more bits out of the N bits of the I/O width are determined to be "Pass" under the second measurement condition (Test (Worst)) is identified as stable pass bit address PBAs and accordingly extracted. In step S4, stable pass bit address PBAs in which N4p or more bits out of the N bits out of the N bits of the I/O width are determined to be "Pass" under the third measurement condition (ID generation) is not output as a fail address FTaddr.

Here, the number of bits N2p and the number of bits N4p are defined as follows.

$$N2p > N4p$$

$$N2p - N4f = \Delta Np \quad \text{Formula 2}$$

The number of bits N2p and the number of bits N4p are thus defined by Formula 2 so that stable pass bit address PBAs extracted in step S2 will not be determined to be fail address FTaddr in step S4 even if the number of I/O bits determined to be "Fail" in stable pass bit address PBAs is $\Delta Np$ or less. Accordingly, unstable generation of chip identification information ID based on stable pass bit addresses PBAs is avoided.

Referring to FIG. 11, a method for generating chip identification information ID of semiconductor device 1 in the first embodiment will be described.

FIG. 11(a) shows a flow diagram illustrating details of step S4 (ID generation).

In FIG. 11(b), the configuration diagram of semiconductor device 1 shown in FIG. 1 is cited.

As a result of steps S1 to S3 performed before delivery, test addresses Taddr made up of a predetermined number of stable fail bit addresses FBAs and a predetermined number of stable pass bit addresses PBAs are stored in test address storage unit 105. Each test address Taddr is selected by storage address Faddr.

In step S401, in response to request signal Req from a server, test address Taddr is read. Memory BIST 104 outputs storage address Faddr to test address storage unit 105. Test address storage unit 105 outputs to memory BIST 104 test address Taddr selected by storage address Faddr.

In step S402, write data Din is written in SRAM macro 103. Memory BIST 104 outputs to SRAM macro 103 the write data Din as well as test address Taddr which is to be used as memory address Raddr. SRAM macro 103 writes the write data Din in the memory cell selected by memory address Raddr. After this, in step S403, SRAM macro 103 outputs the read data Dout of this memory cell.

In step S404, memory BIST 104 determines whether write data Din and read data Dout match (Pass) or mismatch (Fail) each other. In the case where these data match each other, the flow proceeds to step S406. In the case where these data mismatch each other, memory BIST 104 identifies this memory cell address as fail address FTaddr and outputs it to ID generation circuit 106. The memory cell address determined to be "Fail" matches stable fail bit address FBAs. Thus, stable fail bit address FBAs is output to ID generation circuit 106 and stable pass bit address PBAs is not output thereto.

In step S406, it is determined whether or not the above steps have been performed for all test addresses Taddr stored in test address storage unit 105. When the confirmation of the operation of the aforementioned memory cells has been completed by means of all test addresses Taddr, chip identification information ID is generated in step S408. ID generation circuit 106 generates chip identification information ID based on fail addresses FTaddr which have been output from memory BIST 104, and outputs it to control circuit 101.

The value of SNM for a memory cell selected by stable fail bit address FBAs stored in test address storage unit 105 is larger in the step of acceleration test (step S2) than in the step of generating ID (step S4). Accordingly, stable fail bit address FBAs which is determined to be "Fail" in the step of acceleration test will surely be determined to be "Fail" as well in the step of generating ID. Likewise, the value of SNM for a memory cell selected by stable pass bit address PBAs is larger in the step of generating ID than in the step of acceleration test. Accordingly, stable pass bit address PBAs which is determined to be "Pass" in the step of acceleration test will surely be determined to be "Pass" as well in the step of generating ID.

The first measurement condition for extracting stable fail bit address FBAs, the second measurement condition for extracting stable pass bit address PBAs, and the third measurement condition which is set for generation of ID are defined so that respective SNM in the steps satisfy the above-indicated relation. Before the determination as to whether a memory cell is "Pass" or "Fail" is made when ID is to be generated, the memory cell for which the determination is to be made is extracted in advance in the acceleration test.

The extracted stable fail bit address FBAs and stable pass bit address PBAs are stored as test address Taddr in test address storage unit 105. Accordingly, chip identification information ID which is generated based on the result of operational confirmation of test address Taddr stored in test address storage unit 105 is stably generated regardless of temperature variation and/or secular variation of the transistor.

By way of example, test address storage unit 105 stores eight stable fail bit addresses FBAs and 248 stable pass bit addresses PBAs in such a manner that these addresses are mixed together in the storage unit. ID generation circuit 106 generates chip identification information ID from fail addresses FTaddr which are successively output from memory BIST 104, namely the eight stable fail bit addresses FBAs. The 248 stable pass bit addresses PBAs are recorded in test address storage unit 105 in order to ensure the tamper resistance of the chip identification information.

Further, for generation of chip identification information ID, information about I/O bits which are "Fail" in fail bit address FBAs is also used. For example, in the case where the first I/O bit and the seventh I/O bit in fail bit address FBAs are "Fail," data generated by encrypting this 2-bit information, which is information about the number of defective bits, is also added to chip identification information ID. The information about the I/O bits which are defective in the address of the memory cell is not recorded in test address storage unit 105. Accordingly, the temper resistance is further strengthened.

Figure 12:
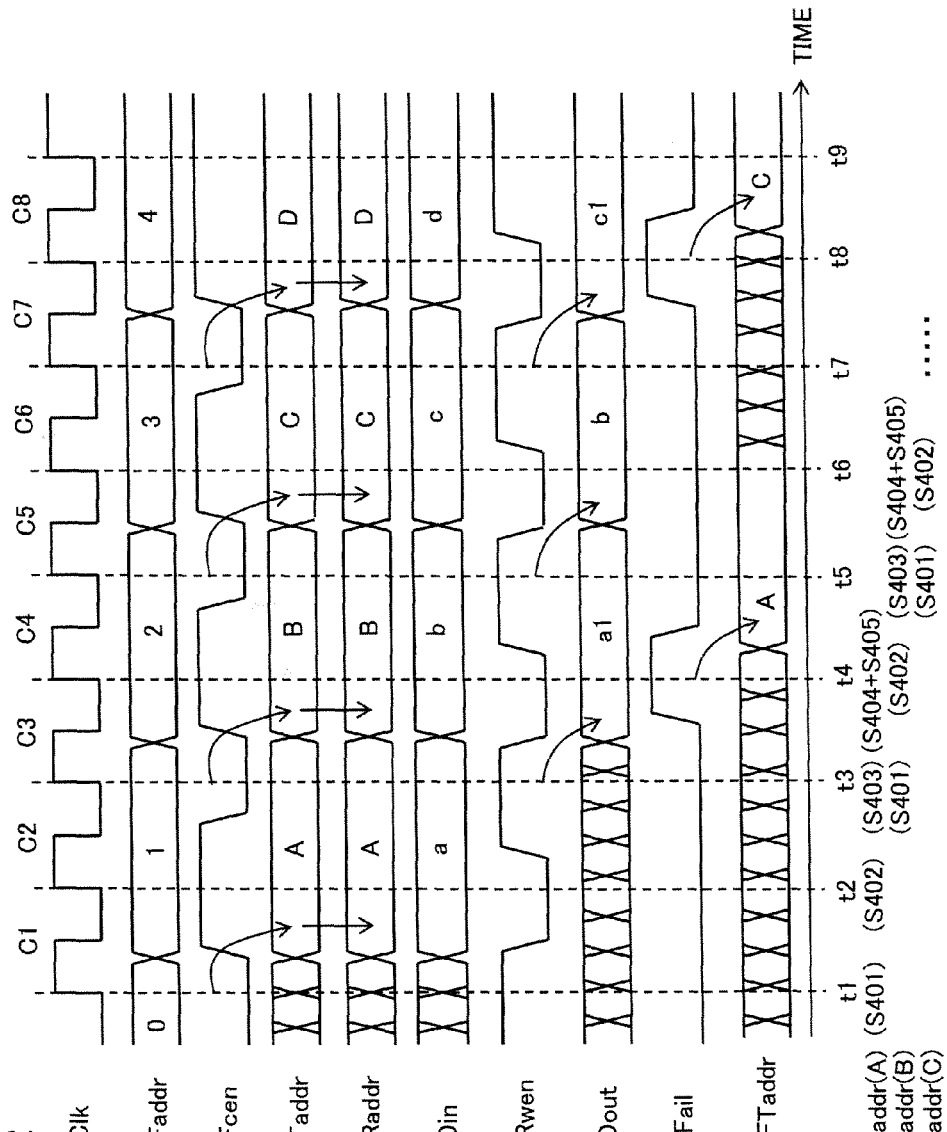
FIG. 12 shows a timing chart illustrating generation of chip identification information of the semiconductor device having a capability of generating chip identification information in the first embodiment.

Referring to FIG. 12, a timing chart for generation of chip identification information ID of semiconductor device 1 in the first embodiment will be described.

The signals shown along the vertical axis of FIG. 12 correspond to the signals shown in FIG. 11(*b*). Time t1 to time t9 shown along the horizontal axis thereof are each the rise timing of clock Clk. Time t1 is the start timing of clock cycle C1 and time t2 is the start timing of clock cycle C2. Time t3 and those subsequent thereto are also respective start timings of respective clock cycles.

Time t1 corresponds to step S401 of FIG. 11(*a*). Test address storage unit 105 which is activated by the low-level enable signal Fcen outputs test address Taddr (address location A) selected by storage address Faddr 0, to memory BIST 104 (time t1). Memory BIST 104 sets memory address Raddr at address location A and outputs write data Din (the data is set to "a") to SRAM macro 103.

Time t2 corresponds to step S402 of FIG. 11(*a*). In response to setting of write enable signal Rwen to the low level, SRAM macro 103 writes data "a" in the memory cell at address location A (time t2).

Time t3 corresponds to step S403 of FIG. 11(*a*). After a predetermined time from time t3, SRAM macro 103 outputs read data Dout (data a1). It should be noted that at time t3, test address Taddr (address location B) selected by storage address Faddr 1 is set to serve as memory address Raddr (step S401). Namely, in SRAM macro 103, reading of data at the former memory address Raddr (address location A) (step S403) and setting of the subsequent memory address Raddr (address location B) (step S401) are performed in parallel with each other.

Time t4 corresponds to steps S404 and S405 of FIG. 11(*a*). At time t4, the data (a) written at address location A in SRAM macro 103 is compared with read data (a1) at address location A. In respective cases where these data match and these data mismatch each other, symbol "Fail" is set to the low level and symbol "Fail" is set to the high level, respectively. Since the write data "a" written to address location A and the read data "a1" read from address location A differ from each other, the determination "Fail" is made in step S404. In response to the determination "Fail," memory BIST 104 outputs to ID generation circuit 106 the address data of address location A as fail address FTaddr.

It should be noted that in response to setting of write enable signal Rwen to the low level at time t4, SRAM macro 103 writes data "b" in the memory cell at address location B (step S402). Namely, in SRAM macro 103, operational confirmation for the former memory address Raddr (address location A) (step S404) and output of fail address FTaddr (step S405) are performed in parallel with writing of data at the subsequent memory address Raddr (address location B) (step S402).

After a predetermined time from time t5, SRAM macro 103 outputs read data Dout at address location B.

At time t6, the data (b) written at address location B of SRAM macro 103 is compared with the read data (b) of address location B. Since these data match each other, the determination "Pass" (symbol "Fail" is set to the low level) is made in step S404. When the determination "Pass" is made, memory BIST 104 does not output the address data at address location B to ID generation circuit 106.

Figure 13:
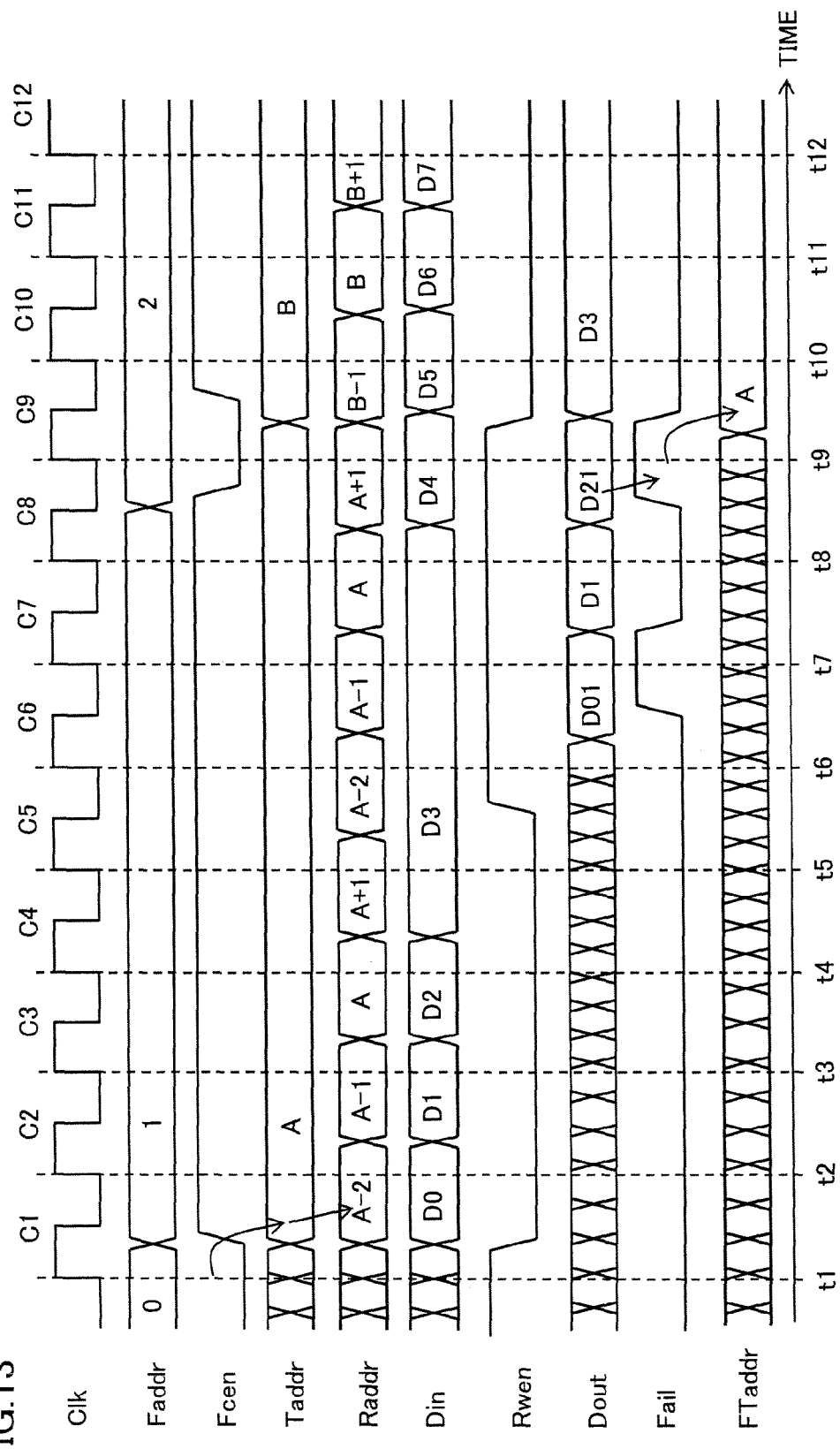
FIG. 13 shows another timing chart illustrating generation of chip identification information of the semiconductor device having a capability of generating chip identification information in the first embodiment.

Referring to FIG. 13, another timing chart illustrating generation of chip identification information ID of semiconductor device 1 in the first embodiment will be described.

FIG. 13 is a timing chart in the case where operational confirmation for SRAM macro 103 is made in consideration of the test pattern dependency. What is to be operationally confirmed is the memory cell selected by memory address Raddr of address location A.

At time t1, in response to setting of storage address Faddr to 0, test address storage unit 105 outputs test address Taddr (address location A) to memory BIST 104. Memory BIST 104 generates, based on test address Taddr of address location A, memory addresses Raddr of address locations "A−2" to "A+1" and write data Din of "D0" to "D3" successively in respective clock cycles from clock cycle C1 to clock cycle C4. In the period from clock cycle C1 to clock cycle C4, write enable signal Rwen is kept at the low level. Accordingly, the memory cell selected by each memory address Raddr is written with the corresponding data.

Further, memory BIST 104 generates memory addresses Raddr of address locations "A−2" to "A" and "A+1" successively in respective clock cycles from clock cycle C5 to clock cycle C8. In the period from clock cycle C5 to clock cycle C8, write enable signal Rwen is kept at the high level. Therefore, the memory cell selected by each address location is not written with write data D3 or write data D4.

In respective clock cycles started at time t6, time t7, and time t8, the data of the memory cells selected by memory addresses Raddr "A−2," "A−1" and "A" are output as read data Dout. Of these data, data D01 which is output in clock cycle C6 is different from write data Din (D0) in clock cycle C1, and therefore, the determination "Fail" is made at time t7. However, address location "A−2" is not test address Taddr and fail address FTaddr is not output.

Meanwhile, data D21 which is output in clock cycle C8 is read data Dout which is output from the memory cell at address location "A" of test address Taddr. Therefore, data D21 is compared with write data D2 in clock cycle C3. Since these data do not match each other, the determination "Fail" is made at time t9. In response to the determination "Fail," memory BIST 104 outputs to ID generation circuit 106 the address data of the address location A as fail address FTaddr.

These other timing settings for step S4 make it possible to perform the operational confirmation of a memory cell selected by test address Taddr in consideration of the test pattern dependency in a similar manner to extraction of stable fail bit address FBAs and stable pass bit address PBAs. At this time, if write data Din and read data Dout of a memory cell other than the memory cell selected by test address Taddr mismatch each other, the address of this memory cell is inhibited from being output as fail address FTaddr. Step S4 is thus performed in consideration of the test pattern dependency, which further improves the reliability of the result of the operational confirmation of a memory cell selected by test address Taddr. Accordingly, chip identification information ID can further stably be generated.

Figure 14:
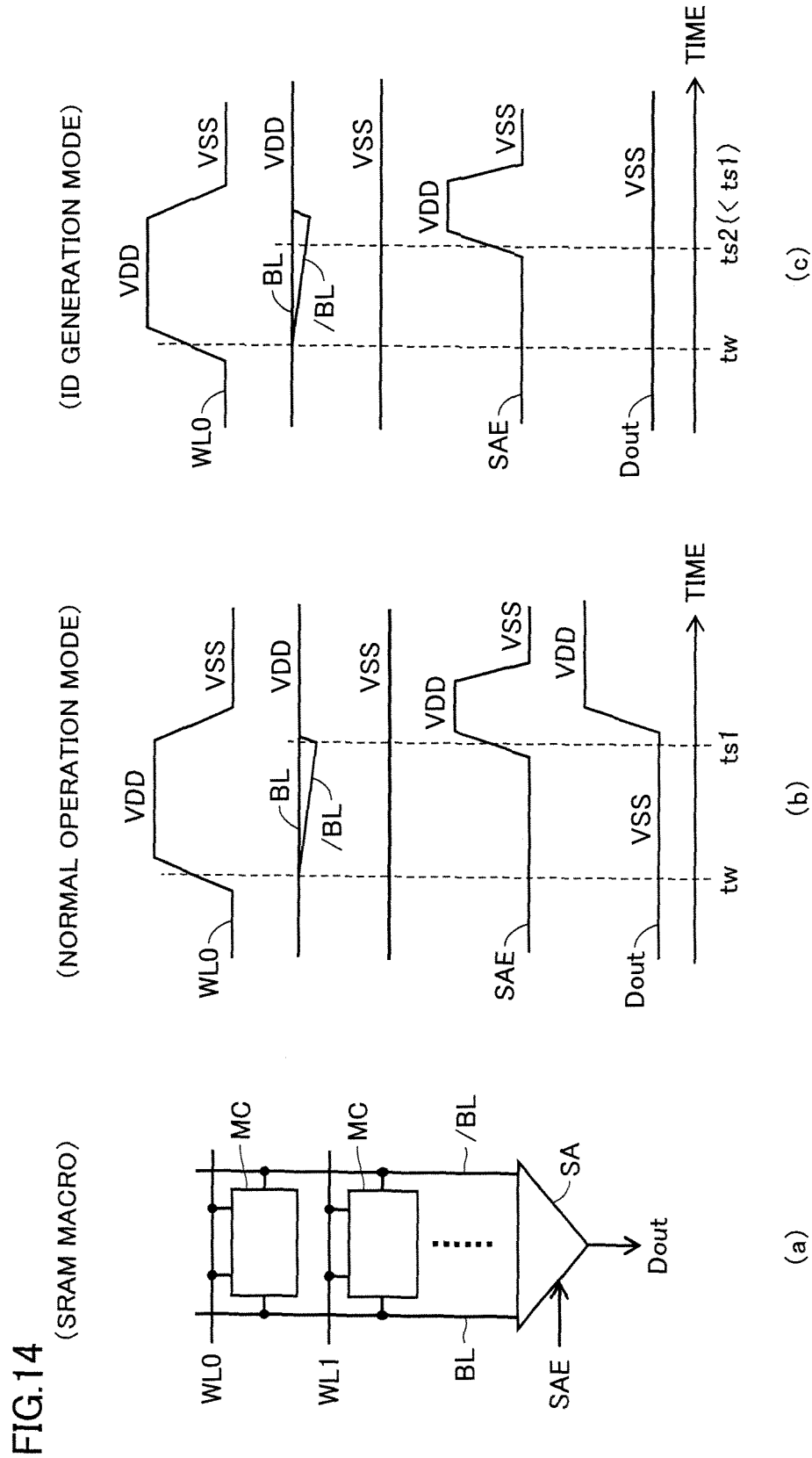
FIG. 14 shows timing charts illustrating activation of the sense amplifier appropriate for generation of chip identification information of the semiconductor device having a capability of generating chip identification information in the first embodiment.

Referring to FIG. 14, a description will be given of a timing chart regarding activation of sense amplifier SA that is appropriate for generation of the chip identification information of semiconductor device 1 in the first embodiment.

FIG. 14(a) shows the same configuration as the configuration of sense amplifier SA shown in FIG. 2(b). FIG. 14(b) shows the activation timing of sense amplifier SA in a normal operation mode. Here, "normal operation mode" is to operate semiconductor device 1 in accordance with a catalog specification. At time tw, word line WL0 is raised. After a predetermined time from time tw, namely at time ts1, sense amplifier enable signal SAE is raised. Sense amplifier SA activated in response to sense amplifier enable signal SAE amplifies the voltage (amplitude) between bit line BL and bit line /BL at that time, and outputs read data Dout of memory cell MC.

FIG. 14(c) is a chart illustrating the activation timing of sense amplifier SA appropriate for step S4 shown in FIGS. 12 and 13. Timing ts2 at which sense amplifier enable signal SAE is to be raised in step S4 (generate chip ID) is set earlier than timing ts1 at which sense amplifier enable signal SAE is raised in the normal operation mode. This manner of setting allows the operational confirmation for memory cell MC selected by stable fail bit address FBAs in the step of generating chip ID to be performed more reliably. Accordingly, chip identification information ID can be generated more stably.

<First Modification of First Embodiment>

Figure 15:
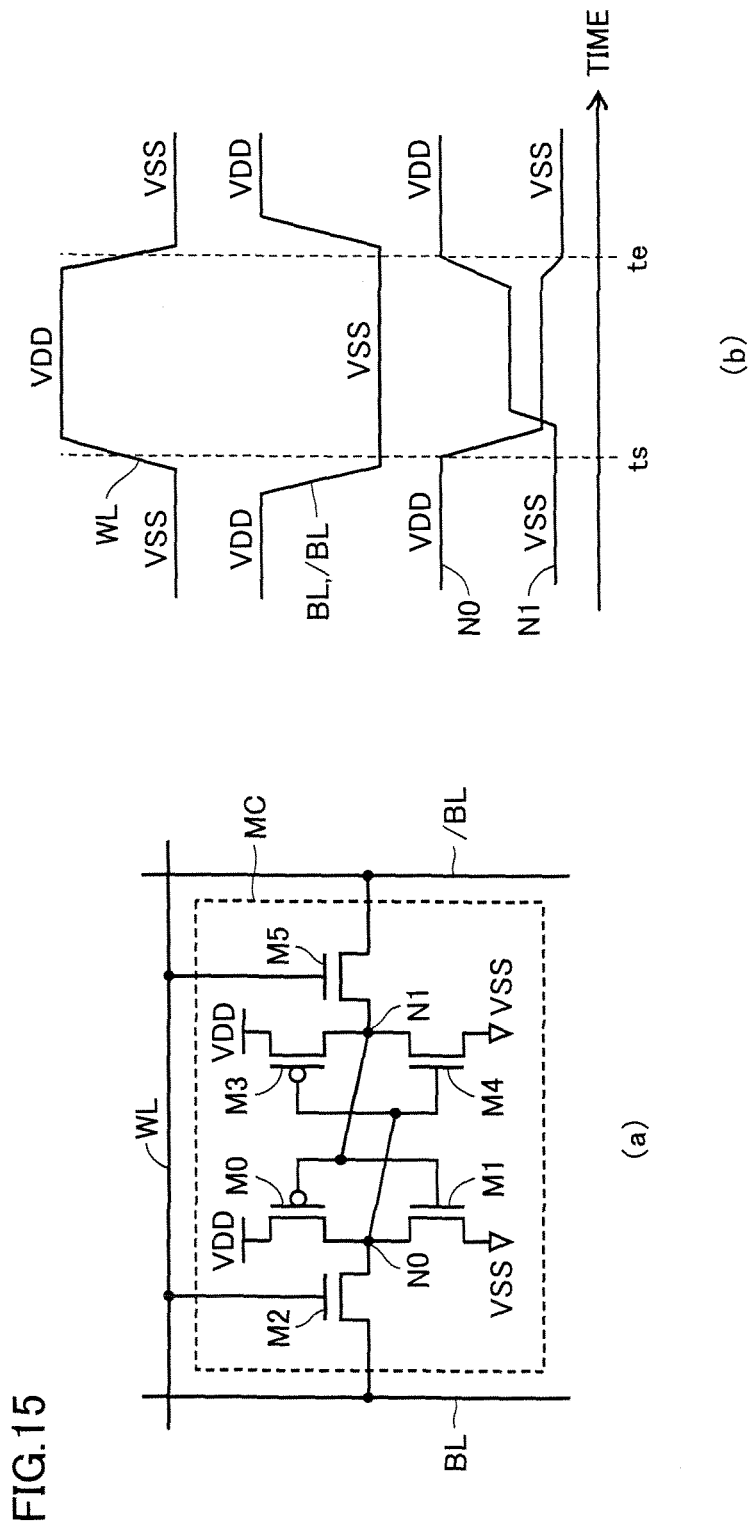
FIG. 15 shows a timing chart illustrating an acceleration test on the semiconductor device having a capability of generating chip identification information in a first modification of the first embodiment.

Referring to FIG. 15, a description will be given of a timing chart regarding an acceleration test on semiconductor device 1 in a first modification of the first embodiment.

In the acceleration test (step S2) on semiconductor device 1 in the first embodiment, the measurement conditions are set as shown in FIG. 6 so that the static noise margin (SNM) at the time a memory cell is read is varied. In contrast, in the acceleration test shown in FIG. 15, it is determined which of data 0 and data 1 memory cell MC is more likely to hold.

The circuit configuration of memory cell MC shown in FIG. 15(a) is identical to that shown in FIG. 2(a). FIG. 15(b) is a timing chart illustrating how respective voltages on node N0 and node N1 change when memory cell MC is written at Low/Low.

Memory cell MC which is the non-selected state at time ts has its node N0 and node N1 on which respective voltages are kept at the high level (VDD) and the low level (VSS), respectively.

At time ts, bit line BL and bit line /BL are both set to the low level. After this, in response to the rise of word line WL, memory cell MC is selected. The operation of selecting memory cell MC with bit line BL and bit line /BL both set at the low level is herein defined as "writing at Low/Low." Respective voltages on node N0 and node N1 of memory cell MC which has been written at Low/Low is determined by the driving ability of transistors whose drain or source is connected to each node. Regarding FIG. 15(b), the potential on node N1 is kept higher than the potential on node N0.

At time te, word line WL changes from the high level to the low level. Then, memory cell MC is set again in the non-selected state and accordingly holds the data having been written at Low/Low.

The data written at Low/Low and held on nodes N0 and N1 is determined by the driving ability of the transistors constituting memory cell MC and the leakage current, for example. In the modification of the first embodiment, the writing at Low/Low is done as an acceleration test. Based on the result of the test, test address Taddr is determined.

Figure 16:
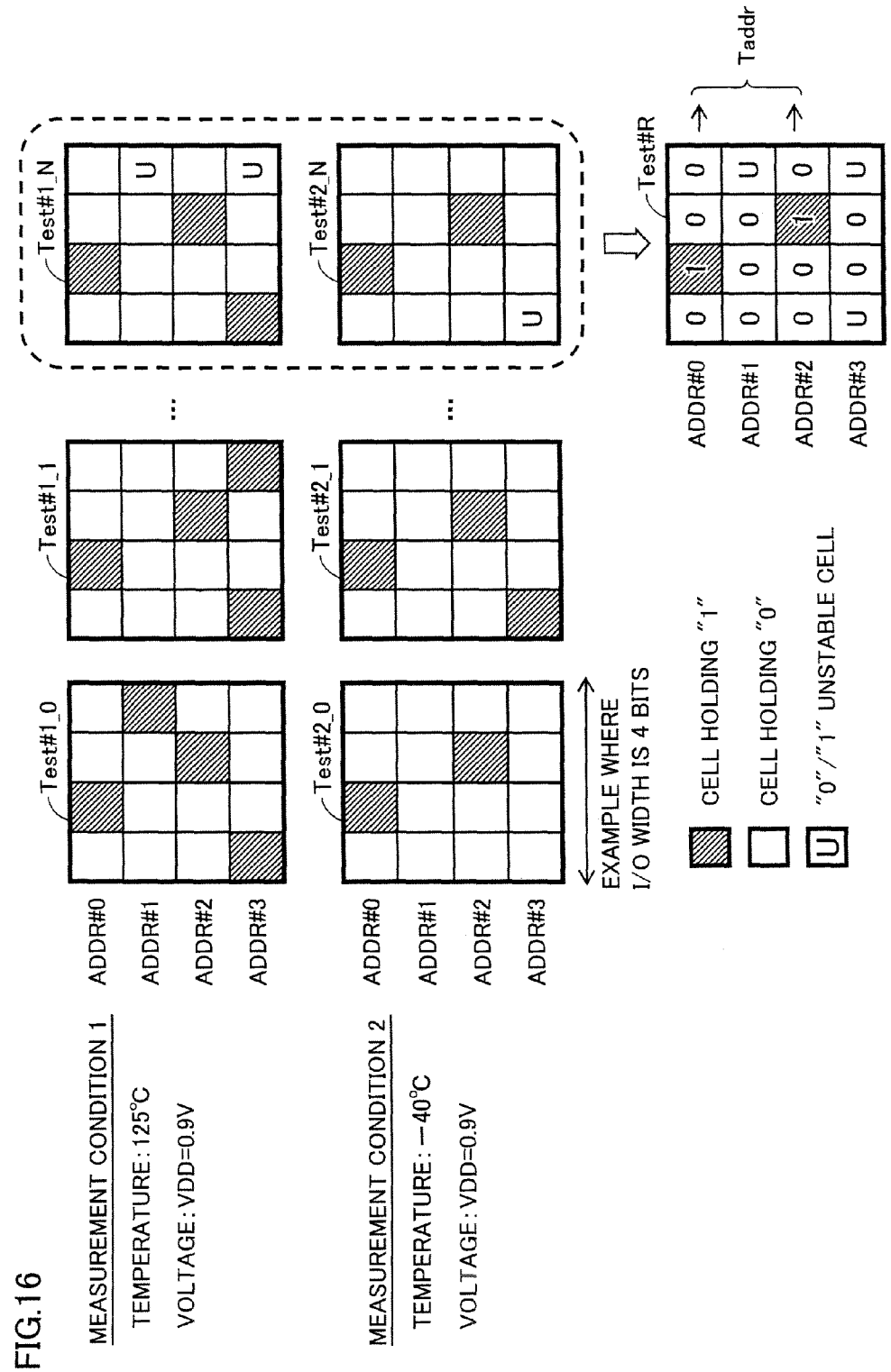
FIG. 16 shows a diagram illustrating a method for an acceleration test on the semiconductor device having a capability of generating chip identification information in the first modification of the first embodiment.

Referring to FIG. 16, a method for the acceleration test on semiconductor device 1 in the first modification of the first embodiment will be described.

Measurement Condition 1 and Measurement Condition 2 are conditions for the acceleration test by writing at Low/Low. Respective measurement temperatures of Measurement Condition 1 and Measurement Condition 2 are set at 125° C. and −40° C., respectively. Respective power supply voltages VDD are both set at 0.9 V.

In FIG. 16, the rectangles each including rectangular units arranged in four rows and four columns schematically represent data tables. The data table is set in the tester memory region. Along the row direction (X direction), the bits of the I/O width, namely four bits, are indicated. Along the column direction (Y direction), four memory addresses (ADDR#0 to ADDR#3) are indicated.

The obliquely hatched rectangular units represent memory cells holding data "1" (high level) as a result of being written at Low/Low. The blank rectangular units represent memory cells holding data "0" (low level) as a result of being written at Low/Low. The rectangular units marked with symbol "U" represent memory cells which have become unstable as a result of being written at Low/Low, namely unstable memory cells whose data held as a result of being written at Low/Low is not constant.

Test address Taddr which is written in test address storage unit 105 is determined in the following manner. First, in step S1 shown in FIG. 3, a nondefective chip is sorted out.

Next, on the nondefective chip thus sorted out, a first acceleration test is performed under Measurement Condition 1. The result of the test is stored in the data table to which symbol "Test#1_0" is given. This acceleration test under Measurement Condition 1 is conducted N times (the result of the Nth test is stored in data table "Test#1_N−1" (not shown)). Based on respective results of the first to Nth tests, the result of the acceleration test under Measurement Condition 1 stored in a data table Test#1_N is stored in the tester memory region.

On the same chip, an acceleration test under Measurement Condition 2 is conducted N times. Based on respective results of the first to Nth tests, the result of the acceleration test under Measurement Condition 2 stored in a data table Test#2_N is stored in the tester memory region.

The combined results of the acceleration tests are stored in a data table Test#R. Where a rectangular unit in data table Test#1_N and a corresponding rectangular unit in data table Test#2_N both hold data "0," data "0" is written in the corresponding rectangular unit in data table Test#R. Data "1" is written in a rectangular unit of data table Test#R in a similar manner. Where symbol "U" is written in at least one of a rectangular unit in data table Test#1_N and the corresponding rectangular unit in data table Test#2_N, symbol "U" is written in the corresponding rectangular unit in data table Test#R.

Finally, memory addresses Raddr each including no unstable memory cell marked with symbol "U" are extracted to serve as test addresses Taddr. In FIG. 16, memory addresses ADDR#0 and ADDR#2 are extracted to serve as test addresses Taddr.

Referring to FIG. 17, a flow of a procedure for generating chip identification information ID of semiconductor device 1 in the first modification of the first embodiment will be described.

FIG. 17(a) shows a detailed flow diagram of the step (step S4) of generating chip identification information ID based on test address Taddr which is generated as a result of writing at Low/Low. In FIG. 17(b), the configuration diagram of semiconductor device 1 shown in FIG. 1 is cited.

In step S402a, test address Taddr extracted in the acceleration test by writing at Low/Low is read in response to request signal Req from a server. Memory BIST 104 outputs storage address Faddr to test address storage unit 105. Test address storage unit 105 outputs to memory BIST 104 test address Taddr which is selected by storage address Faddr.

In step S403*a*, memory BIST 104 outputs to SRAM macro 103 test address Taddr to serve as memory address Raddr. At this time, write data Din is not output from memory BIST 104 to SRAM macro 103. After this, in step S403*a*, SRAM macro 103 outputs read data Dout of the memory cell.

In step S404*a*, memory BIST 104 outputs read data Dout to ID generation circuit 106. In step S405*a*, it is determined whether or not the above-described steps have been performed for all test addresses Taddr stored in test address storage unit 105. In the case where reading of all test addresses Taddr has not been completed, storage address Faddr is incremented in step S406*a*. When output of read data Dout of the memory cell is completed for all test addresses Taddr, chip identification information ID is generated by the ID generation circuit in step S407*a*.

In contrast to step S4 shown in FIG. 11, generation of chip identification information ID based on test address Taddr which is generated as a result of writing at Low/Low is done based on the data held in the memory cell selected by test address Taddr. The memory cell selected by test address Taddr has been confirmed as holding stable data written at Low/Low. Accordingly, chip identification information ID can be generated stably against variations of the characteristics of transistors.

Referring to FIG. 18, a description will be given of another flow of a procedure for generating chip identification information ID of semiconductor device 1 in the first modification of the first embodiment.

The method for generating chip identification information ID shown in FIG. 17 and the other example of the method for generating chip identification information ID shown in FIG. 18 differ from each other in terms of data holding characteristics of memory cells stored in test address storage unit 105. In test address storage unit 105 shown in FIG. 18, the address is stored of a memory cell for which it has been determined that the data written at Low/Low in the acceleration test and held in the memory cell is unstable.

In step S402*b*, in response to request signal Req from a server, memory BIST 104 sets memory address Raddr to an address other than test address Taddr. In step S403*b*, read data Dout of the memory cell which is selected by memory address Raddr is output. In step S404*b*, memory BIST 104 outputs this read data Dout to ID generation circuit 106. In step S405*b*, it is determined whether or not the number of read data Dout has reached a predetermined number thereof which is necessary for generating chip identification information ID. When the number of read data Dout has not reached the predetermined number, memory address Raddr is incremented by one in step S406*b*. When the number of read data Dout has reached the predetermined number, ID generation circuit 106 generates chip identification information ID in step S407*b*.

As to the first modification of the first embodiment, the configuration and the method for determining test address Taddr have been described based on the example where writing at Low/Low is done to select memory cell MC with bit line BL and bit line /BL both set at the low level. The method for determining the bias of the data holding characteristics of memory cell MC is not limited to the writing at Low/Low. For example, writing at High/High where memory cell MC is selected with bit line BL and bit line /BL set at the high level is also applicable. Further, the reproducibility of data held in a memory cell immediately after the power supply voltage is applied (power-on) can be confirmed, so that the address of the memory cell holding the reproducible data after power-on can be used as test address Taddr.

<Second Modification of First Embodiment>

Figure 19:
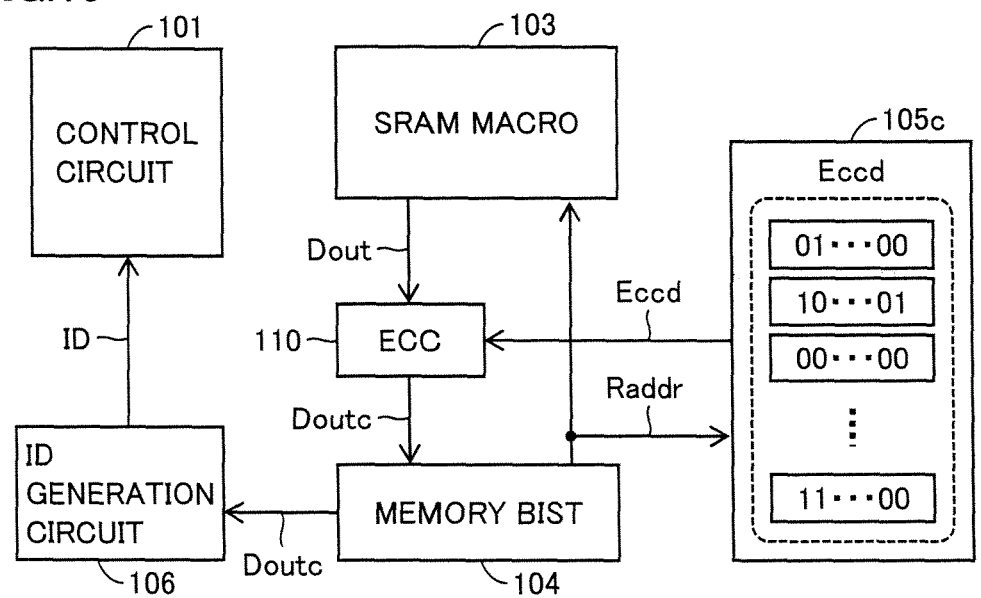
FIG. 19 shows a configuration diagram of a semiconductor device having a capability of generating chip ID information in a second modification of the first embodiment.

Referring to FIG. 19, a configuration of semiconductor device 1 in a second modification of the first embodiment will be described.

Semiconductor device 1 in the second modification of the first embodiment differs from semiconductor device 1 of the first embodiment shown in FIG. 1 in that the former additionally includes an error correction circuit 110.

In FIG. 19, error correction circuit 110 is disposed between SRAM macro 103 and memory BIST 104. Error correction circuit 110 corrects one-bit error with an error correction code Eccd for read data Dout of SRAM macro 103, and outputs the data in which the error has been corrected, to serve as read data Doutc to memory BIST 104.

An ECC code storage unit 105*c* stores, as error correction code Eccd, parity data corresponding to memory address Raddr. In response to input of memory address Raddr, ECC code storage unit 105*c* outputs, to error correction circuit 110, error correction code Eccd which is selected by memory address Raddr. SRAM macro 103 outputs, to error correction circuit 110, read data Dout of the memory cell selected by memory address Raddr which is output from memory BIST 104. Based on error correction code Eccd, error correction circuit 110 corrects the error in read data Dout, and outputs the resultant read data Doutc.

When chip identification information ID is to be generated, even if selected memory addresses include a memory address of an unstable memory cell, error correction circuit 110 appropriately corrects output data Dout of the memory cell. Accordingly, chip identification information ID can be generated stably.

Second Embodiment

Figure 20:
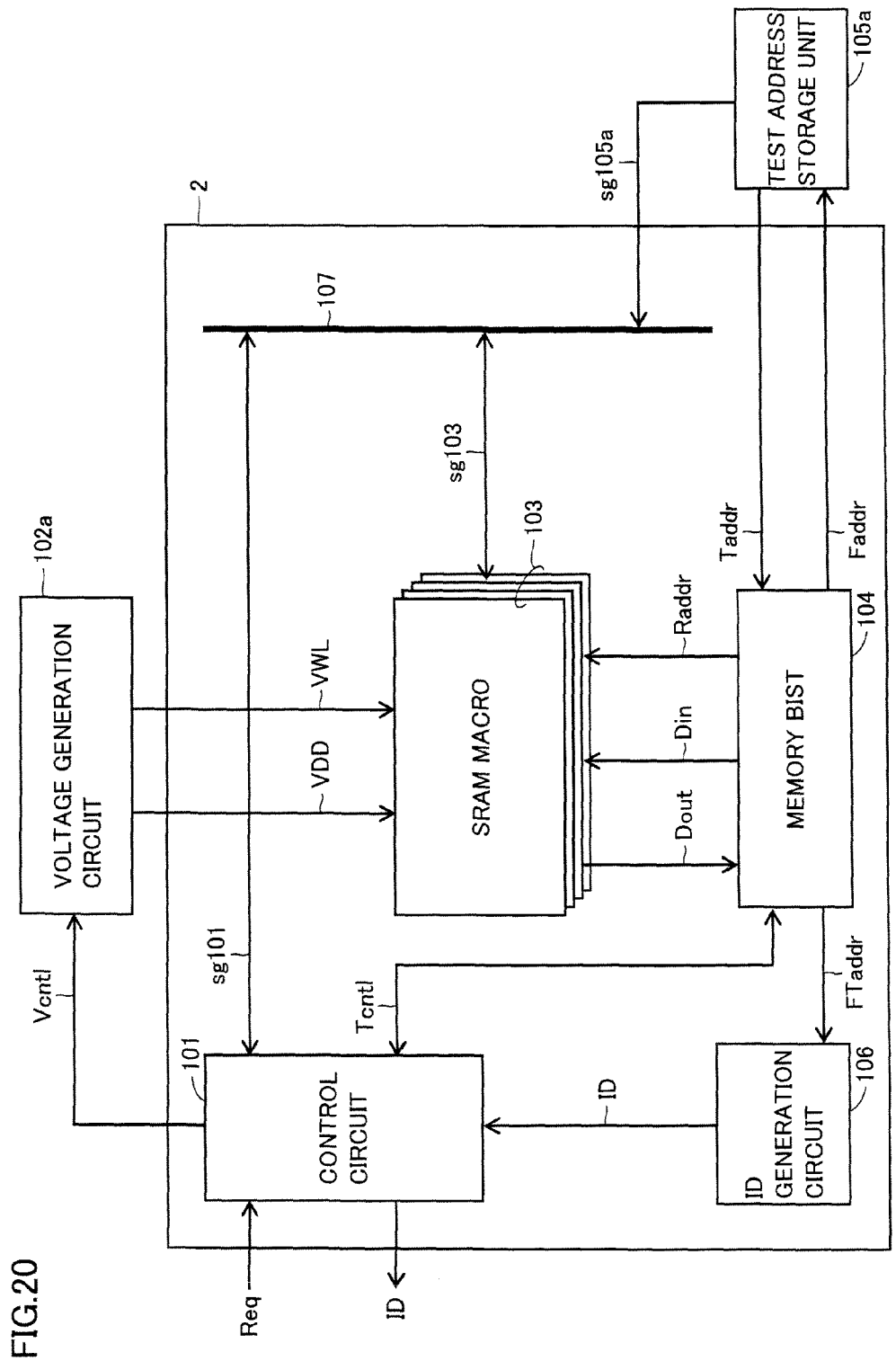
FIG. 20 shows a configuration diagram of a semiconductor device having a capability of generating chip identification information in a second embodiment.

Referring to FIG. 20, a configuration of a semiconductor device 2 in a second embodiment will be described. Semiconductor device 2 has the configuration corresponding to that of semiconductor device 1 in the first embodiment except that the former does not include voltage generation circuit 102 and test address storage unit 105.

To SRAM macro 103 of semiconductor device 2, power supply voltage VDD and word line voltage VWL that are output from a voltage generation circuit 102*a* formed on a chip separate from semiconductor device 2 are supplied. Voltage generation circuit 102*a* is limited in its operation by signal Vcnt1 which is output from control circuit 101 of semiconductor device 2.

A test address storage unit 105*a* is formed by another chip (nonvolatile memory for example) which is separate from semiconductor device 2. In test address storage unit 105*a*, test address Taddr extracted in the acceleration test is written in a similar manner to that stored in test address storage unit 105 of semiconductor device 1 in the first embodiment and the modification of the first embodiment. Since semiconductor device 2 and test address storage unit 105*a* are formed as separate chips, the process for manufacturing semiconductor device 2 is simplified. Accordingly, the manufacturing cost of semiconductor device 2 can be reduced.

Third Embodiment

Figure 21:
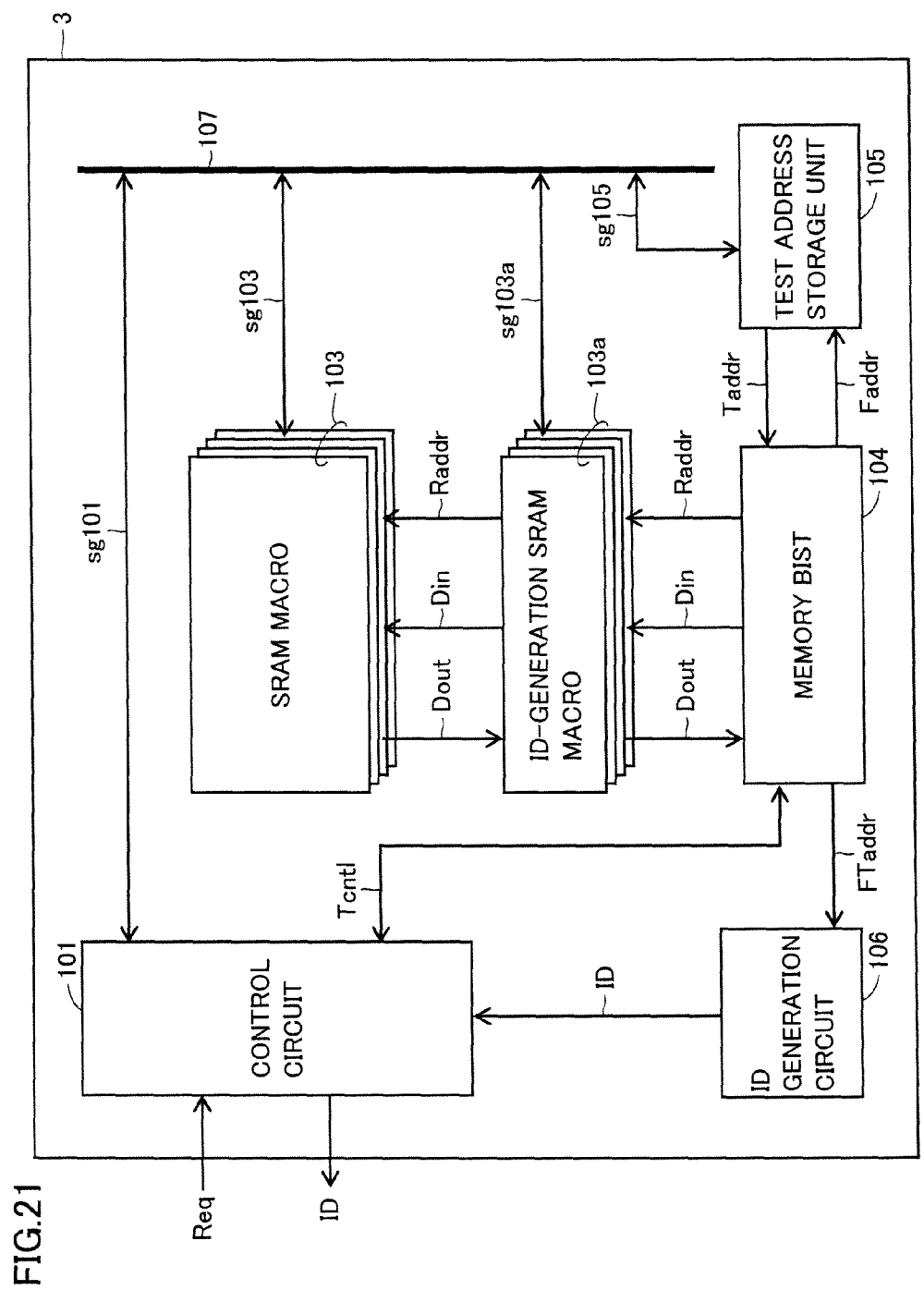
FIG. 21 shows a configuration diagram of a semiconductor device having a capability of generating chip identification information in a third embodiment.

Referring to FIG. 21, a configuration of a semiconductor device 3 in a third embodiment will be described. Semiconductor device 3 has a configuration corresponding to the configuration of semiconductor device 1 in the first embodiment except that the former does not include voltage generation circuit 102 of semiconductor device 1 in the first embodiment and that the former additionally includes an ID-generation SRAM macro 103a configured to generate chip identification information ID. In the case where ID-generation SRAM macro 103a generates chip identification information ID, the voltage supplied to ID-generation SRAM macro 103a is not changed.

In response to storage address Faddr which is output from memory BIST 104, test address storage unit 105 outputs to memory BIST 104 test address Taddr which is associated with this storage address Faddr. Based on test address Taddr, memory BIST 104 outputs memory address Raddr to ID-generation SRAM macro 103a. Further, memory BIST 104 outputs to ID-generation SRAM macro 103 write data Din to be written in the memory cell selected by memory address Raddr.

Memory BIST 104 receives from ID-generation SRAM 103a read data Dout of the memory cell selected by memory address Raddr. Memory BIST 104 determines whether write data Din and read data Dout match or mismatch each other and, when these data do not match each other, memory BIST 104 outputs memory address Raddr as fail address FTaddr.

Referring to FIG. 22, a description will be given of a configuration of ID-generation SRAM macro 103a included in semiconductor device 3 in the third embodiment.

As shown in FIG. 22(a), a memory cell MCa of ID-generation SRAM macro 103a has a circuit configuration identical to that of memory cell MC shown in FIG. 2. Thus, the description of the circuit configuration of memory cell MCa will not be repeated.

FIG. 22(b) and FIG. 22(c) show two different SNM characteristics of memory cell MCa included in ID-generation SRAM macro 103a.

For memory cell MCa having the SNM characteristic of FIG. 22(b), conductance gm1a of an n-type transistor M1a is set larger than conductance gm2a of an n-type transistor M2a. For example, they are set as follows: β=gm1a/gm2a=1.5. Likewise, conductance gm4a of an n-type transistor M4a is set larger than conductance gm5a of an n-type transistor M5a. For example, they are set as follows: β=gm4a/gm5a=1.5. Here, the mark "/" is a sign of subtraction.

For memory cell MCa having the above-indicated conductance ratio, a sufficient SNM is ensured, and write data Din and read data Dout of memory cell MCa match each other. Accordingly, stable pass bit address PBAs can be extracted without changing the voltage supplied to SRAM macro 103a, namely without performing the acceleration test.

In contrast, for a memory cell MCa having the SNM characteristic of FIG. 22(c), one of the value of gm1a/gm2a and the value of gm4a/gm5a is set to the substantially identical value. For example, one of the conductance ratios is set as follows: β=gm4a/gm5a=1. The other conductance ratio is set so that a sufficient SNM is ensured. In this case, there is no SNM on the high level side of node N0. Accordingly, the address of memory cell MCa is extracted as stable fail bit address FBAs without performing the acceleration test.

In FIG. 21, ID-generation SRAM macro 103a has a configuration where memory cells MCa having the characteristic of FIG. 22(b) and memory cells MCa having the characteristic of FIG. 22(c) are arranged at random. In the case where stable fail bit address FBAs and stable pass bit address PBAs are to be extracted, ID-generation SRAM macro 103a is activated while SRAM macro 103 is inactivated.

Based on the result of the operational confirmation of ID-generation SRAM 103a by memory BIST 104, stable fail bit address FBAs and stable pass bit address PBAs are extracted. A predetermined number of extracted stable fail bit addresses FBAs and a predetermined number of extracted stable pass bit addresses PBAs are stored to serve as test addresses Taddr in test address storage unit 105. These steps are performed through the memory of LSI tester 109 shown in FIG. 4.

Semiconductor device 3 in the third embodiment does not require the voltage generation circuit, which is effective in reducing the chip area. Further, the ID-generation SRAM enables stable generation of test addresses. Accordingly, stable generation of chip identification information is achieved while the chip area is prevented from increasing.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device having a capability of generating chip identification information, comprising:
   a memory cell array including a plurality of memory cells arranged in rows and columns;
   a test address storage unit configured to store a plurality of test addresses;
   a self-diagnostic circuit configured to output a fail address based on a result of operational confirmation of said memory cell selected by said test address; and
   an identification information generation circuit configured to generate chip identification information based on said fail address output by said self-diagnostic circuit.

2. The semiconductor device according to claim 1, wherein
   said test address storage unit is configured to store, as said test address, a defective cell address of said memory cell under a first measurement condition,
   said self-diagnostic circuit is configured to output said defective cell address based on a result of operational confirmation, under a third measurement condition, of said memory cell selected by said defective cell address, and
   a static noise margin for said memory cell under said first measurement condition is set larger than a static noise margin for said memory cell under said third measurement condition.

3. The semiconductor device according to claim 2, wherein
   said test address storage unit is further configured to store, as said test address, a normal cell address of said memory cell under a second measurement condition,
   said self-diagnostic circuit is configured to make operational confirmation, under said third measurement condition, of said memory cell selected by said normal cell address, and
   a static noise margin for said memory cell under said third measurement condition is set larger than a static noise margin for said memory cell under said second measurement condition.

4. The semiconductor device according to claim 3, further comprising a voltage generation circuit configured to supply a power supply voltage to said memory cell array, wherein said power supply voltage under said first measurement condition is set larger than said power supply voltage under said third measurement condition.

5. The semiconductor device according to claim 4, wherein said power supply voltage under said third measurement condition is set larger than said power supply voltage under said second measurement condition.

6. The semiconductor device according to claim 1, further comprising a sense amplifier configured to output data of said memory cell,
said test address storage unit is configured to store, as said test address, a defective cell address of said memory cell under a fourth measurement condition,
said self-diagnostic circuit is configured to output said defective cell address based on a result of operational confirmation, under a sixth measurement condition, of said memory cell selected by said defective cell address, and
a timing of activation of said sense amplifier under said sixth measurement condition is set earlier than a timing of activation of said sense amplifier under said fourth measurement condition.

7. The semiconductor device according to claim 6, wherein
said test address storage unit is configured to store, as said test address, a normal cell address of said memory cell under a fifth measurement condition, and
a timing of activation of said sense amplifier under said fifth measurement condition is set earlier than a timing of activation of said sense amplifier under said sixth measurement condition.

8. The semiconductor device according to claim 2, wherein
said memory cell array has a bit width of N bits (N is an integer of 2 or more),
in said defective cell address under said first measurement condition, a first number of bits out of said N bits of the bit width is defective,
in said defective cell address under said third measurement condition, a second number of bits out of said N bits of the bit width is defective, and
said first number of bits is set larger than said second number of bits.

9. The semiconductor device according to claim 3, wherein
in said normal cell address under said second measurement condition, a third number of bits out of said N bits of the bit width is normal,
in said normal cell address under said third measurement condition, a fourth number of bits out of said N bits of the bit width is normal, and
said third number of bits is set larger than said fourth number of bits.

10. A semiconductor device having a capability of generating chip identification information, comprising:
a memory cell including a pair of nodes holding complementary data and a pair of access transistors connected to said pair of nodes;
a memory cell array including a plurality of said memory cells arranged in rows and columns;
a test address storage unit configured to store a test address;
a self-diagnostic circuit to which the data held in said memory cell selected by said test address is input; and
an identification information generation circuit configured to generate chip identification information based on said data which is output by said self-diagnostic circuit.

11. The semiconductor device according to claim 10, wherein said data held in said memory cell is data which is held after a power supply voltage is applied to said pair of nodes for a predetermined time through said pair of access transistors.

12. The semiconductor device according to claim 10, wherein said data held in said memory cell is data held on said pair of nodes after a power supply voltage is applied to said memory cell.

13. A semiconductor device having a capability of generating chip identification information, comprising:
a memory cell including a pair of nodes holding complementary data and a pair of access transistors connected to said pair of nodes;
a memory cell array including a plurality of said memory cells arranged in rows and columns;
a test address storage unit configured to store a test address;
a self-diagnostic circuit configured to output said test address based on a result of operational confirmation of said memory cell selected by said test address; and
an identification information generation circuit configured to generate chip identification information based on said test address output by said self-diagnostic circuit,
said memory cell array including a first memory cell and a second memory cell,
said first memory cell being configured to output, to said self-diagnostic circuit through said pair of access transistors, the data held on said pair of nodes, and
said second memory cell being configured to output, to said self-diagnostic circuit through said pair of access transistors, fixed data stored on said nodes of the pair.

14. The semiconductor device according to claim 13, wherein
said memory cell further includes, between said nodes of the pair, a first inverter and a second inverter constituting a latch circuit, and
a first inverter included in said second memory cell has a static noise margin of a negative value.

* * * * *